(12) United States Patent
Xie et al.

(10) Patent No.: US 11,233,115 B2
(45) Date of Patent: Jan. 25, 2022

(54) DISPLAY PANEL AND MANUFACTURING METHOD THEREOF, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Xuewu Xie, Beijing (CN); Hao Liu, Beijing (CN); Yu Ai, Beijing (CN); Bowen Liu, Beijing (CN); Yubao Kong, Beijing (CN); Huihui Li, Beijing (CN)

(73) Assignees: HEFEI XINSHENG OPTOELECTRONICS TECHNOLOGY CO., LTD, Hefei (CN); BOE Technology Group Co., Ltd., Beijing (CN)

( * ) Notice: Subject to any disclaimer, the term of this patent is extended or adjusted under 35 U.S.C. 154(b) by 68 days.

(21) Appl. No.: 16/624,400

(22) PCT Filed: Nov. 15, 2018

(86) PCT No.: PCT/CN2018/115700
§ 371 (c)(1),
(2) Date: Dec. 19, 2019

(87) PCT Pub. No.: WO2019/174289
PCT Pub. Date: Sep. 19, 2019

(65) Prior Publication Data
US 2021/0151548 A1 May 20, 2021

(30) Foreign Application Priority Data
Mar. 12, 2018 (CN) .......................... 201810202060.X

(51) Int. Cl.
*H01L 27/32* (2006.01)
*H01L 51/56* (2006.01)

(52) U.S. Cl.
CPC ...... *H01L 27/3283* (2013.01); *H01L 27/3246* (2013.01); *H01L 51/56* (2013.01); *H01L 2251/5392* (2013.01)

(58) Field of Classification Search
CPC . H01L 27/3246; H01L 51/56; H01L 27/3283; H01L 27/3218
See application file for complete search history.

(56) References Cited

U.S. PATENT DOCUMENTS 10,985,339 B2 * 4/2021 Choi .................. H01L 27/3211
2010/0029028 A1 2/2010 Song et al.
(Continued)

FOREIGN PATENT DOCUMENTS

CN 105448957 A 3/2016
CN 107393939 A 11/2017
(Continued)

OTHER PUBLICATIONS

International search report of PCT application No. PCT/CN2018/115700 dated Feb. 14, 2019.
(Continued)

*Primary Examiner* — Jaehwan Oh
(74) *Attorney, Agent, or Firm* — Fay Sharpe LLP

(57) ABSTRACT

A display panel and a manufacturing method thereof, and a display device are disclosed. The display panel includes: a substrate, a plurality of pixel units and a pixel defining layer, each of at least one of the pixel units comprises an organic functional layer, and the organic functional layer has a raised edge; an orthographic projection of the organic functional layer of each pixel unit on the substrate is surrounded by an orthographic projection of the second defining layer on the (Continued)

substrate, an orthographic projection of the first defining layer on the substrate covers the orthographic projection of the second defining layer on the substrate, and the orthographic projection of the first defining layer on the substrate overlaps with an orthographic projection of at least a portion of the raised edge on the substrate the brightness uniformity of the display panel may be improved.

16 Claims, 27 Drawing Sheets

(56) References Cited

U.S. PATENT DOCUMENTS

| | | | | |
|---|---|---|---|---|
| 2011/0198990 A1* | 8/2011 | Yoshida | ............... | H05B 33/10 313/504 |
| 2017/0194395 A1 | 7/2017 | Hu et al. | | |
| 2018/0261798 A1* | 9/2018 | Choi | ............... | H01L 51/0023 |
| 2019/0096968 A1* | 3/2019 | Zhang | ............... | H01L 51/56 |
| 2019/0173046 A1* | 6/2019 | Jeong | ............... | H01L 51/5056 |
| 2019/0237527 A1* | 8/2019 | Lee | ............... | H01L 51/5225 |
| 2020/0303688 A1* | 9/2020 | Kwon | ............... | H01L 51/56 |
| 2021/0066643 A1* | 3/2021 | Choi | ............... | H01L 51/5218 |

FOREIGN PATENT DOCUMENTS

| | | |
|---|---|---|
| CN | 107706222 A | 2/2018 |
| CN | 207834304 U | 9/2018 |
| JP | 2008091071 A | 4/2008 |

OTHER PUBLICATIONS

Extended European search report of counterpart EP application No. 18909397.4 dated Nov. 11, 2021.

* cited by examiner

DISPLAY PANEL AND MANUFACTURING METHOD THEREOF, AND DISPLAY DEVICE

CROSS-REFERENCE TO RELATED APPLICATION

This application is a 371 of PCT Patent Application No. PCT/CN2018/115700 filed on Nov. 15, 2018, which claims priority to Chinese Patent Application No. 201810202060.X, filed on Mar. 12, 2018 and entitled "DISPLAY PANEL AND MANUFACTURING METHOD THEREFOR, AND DISPLAY APPARATUS", the entire contents of which are incorporated herein by reference.

TECHNICAL FIELD

The present application relates to a display panel, a manufacturing method thereof and a display device.

BACKGROUND

Organic light-emitting diode (OLED) display panels are widely used in smart phones, tablet computers, televisions and other terminal products due to their advantages of a self-luminous ability, high contrast, small thickness, wide viewing angle, fast reaction speed, etc.

SUMMARY

The present application provides a display panel, a manufacturing method thereof and a display device.

According to a first aspect, a display panel is provided. The display panel includes:

a substrate; and a plurality of pixel units and a pixel defining layer which are on the substrate, each of at least one of the pixel units includes an organic functional layer, and the organic functional layer has a raised edge; wherein the pixel defining layer includes a first defining layer and a second defining layer, the first defining layer is on a side of the second defining layer away from the substrate; and an orthographic projection of the organic functional layer of each pixel unit on the substrate is surrounded by an orthographic projection of the second defining layer on the substrate, an orthographic projection of the first defining layer on the substrate covers the orthographic projection of the second defining layer on the substrate, and the orthographic projection of the first defining layer on the substrate overlaps with an orthographic projection of at least a portion of the raised edge on the substrate.

Optionally, the orthographic projection of the first defining layer on the substrate covers orthographic projection of the raised edge of at least one of the pixel units on the substrate.

Optionally, a surface of the second defining layer adjacent to the organic functional layer has a depression, and the depression is used to contain at least a portion of the raised edge of the organic functional layer.

Optionally, each of the at least one of the pixel units further includes a first electrode and a second electrode, the organic functional layer is on a side of the first electrode away from the substrate, and the second electrode is on a side of the first defining layer away from the organic functional layer.

Optionally, a material of the second defining layer is a conductive material, the second defining layer has a conductive isolation region, and the conductive isolation region is used to isolate first electrodes in any two adjacent pixel units.

Optionally, a through hole is in the conductive isolation region of the second defining layer, and the through hole is filled with an insulating material.

Optionally, a through hole is in the conductive isolation region of the second defining layer, a portion of the first defining layer is in the through hole, and the material of the first defining layer is an insulating material.

Optionally, an orthographic projection of the first electrode of each pixel unit on the substrate is surrounded by the orthographic projection of the second defining layer on the substrate; and a thickness of the second defining layer is more than or equal to the sum of a thickness of the first electrode and a thickness of the organic functional layer.

Optionally, an orthographic projection of the second electrode on the substrate covers a portion of the orthographic projection of the organic functional layer on the substrate that is not covered by the orthographic projection of the first defining layer on the substrate.

Optionally, a material of the first defining layer is an insulating material; and a material of the second defining layer is any one of an insulating material and a conductive material.

Optionally, the material of the first defining layer is polyimide; and the material of the second defining layer is any one of silicon nitride, silicon monoxide, and a metal oxide.

According to a second aspect, a manufacturing method of a display panel is provided. The method includes:

forming a plurality of pixel units and a pixel defining layer which are on the substrate;

wherein each pixel unit includes a first electrode, an organic functional layer and a second electrode, the organic functional layer is on a side of the first electrode away from the substrate, and the organic functional layer has a raised edge; the pixel defining layer includes a first defining layer and a second defining layer, the first defining layer is on a side of the second defining layer away from the substrate; and, an orthographic projection of the organic functional layer of each pixel unit on the substrate is surrounded by an orthographic projection of the second defining layer on the substrate, an orthographic projection of the first defining layer on the substrate covers the orthographic projection of the second defining layer on the substrate, the orthographic projection of the first defining layer on the substrate overlaps with an orthographic projection of at least a portion of the raised edge on the substrate, and the second electrode is on a side of the first defining layer away from the organic functional layer.

According to a third aspect, a display device is provided, and the display device includes any of the display panels according to the first aspect.

DETAILED DESCRIPTION

The present application will be described in further detail with reference to the accompanying drawings, to present the principles and advantages of the present application clearer.

In related arts, an existing OLED display panel includes a substrate, as well as a first electrode, an organic functional layer and a second electrode which are arranged on the substrate sequentially. The organic functional layer includes a hole injection layer, as well as a hole transport layer, an organic light-emitting layer, an electron transport layer and an electron injection layer which are arranged on the hole injection layer sequentially. Currently, the organic functional layer is formed mainly through an inkjet printing process. The light-emitting principle of the OLED display panel is as follows. A voltage is applied between the first electrode and the second electrode. Under the action of this voltage, holes in the hole injection layer move to the organic light-emitting layer through the hole transport layer, and electrons in the electron injection layer move to the organic light-emitting layer through the electron transport layer. At last, the holes and the electrons meet and combine in the organic light-emitting layer, and energy released in the combination process excites chemical molecules in the organic light-emitting layer to emit light. In order to improve a utilization rate of an OLED material and reduce a manufacturing cost of an OLED display panel, an inkjet printing process is generally adopted to form an organic functional layer. However, in a formation process of forming a film with droplets, when a droplet from a droplet discharge nozzle drips on a substrate, it often flows from an intermediate region to an edge region. As a result, the thickness of the edge region of the film formed on the substrate is always greater than that of the intermediate region of the film, thereby forming a "coffee ring" effect. This effect causes the brightness of the edge region to be higher than the brightness of the intermediate region when light is emitted, resulting in non-uniform brightness of the display panel.

Figure 1A:
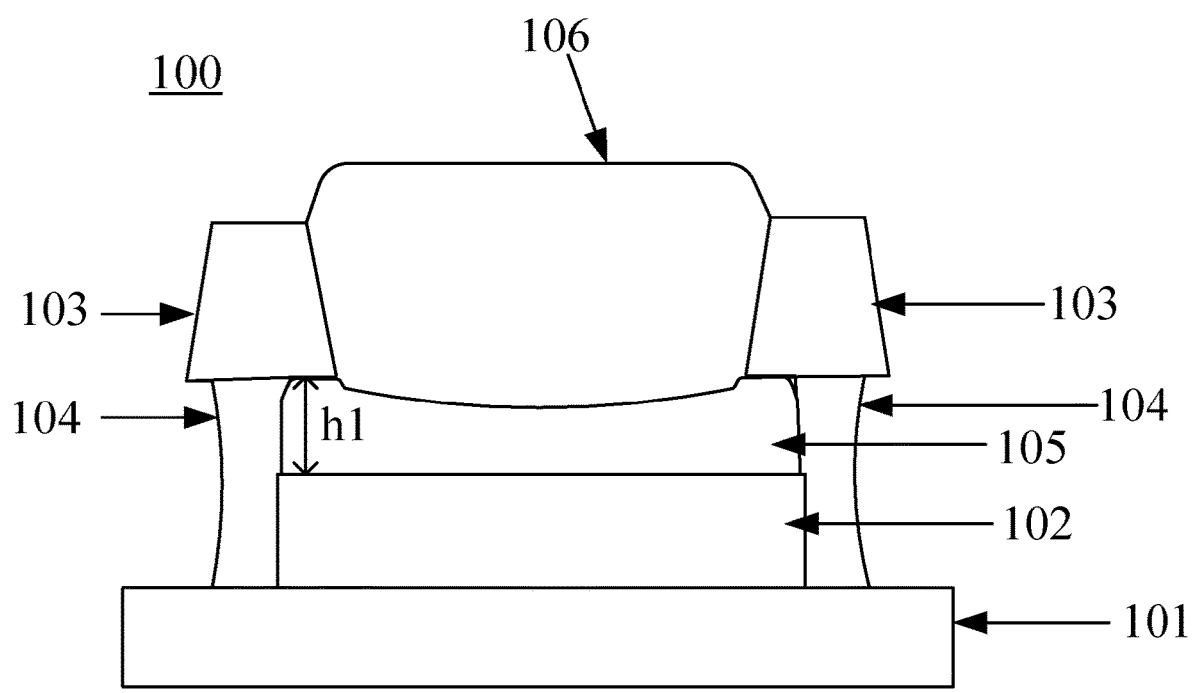
FIG. 1A is a schematically structural diagram of a display panel provided by an embodiment of the present application.

In order to reduce the "coffee ring" effect and improve the brightness uniformity of the display panel, embodiments of the present application provide a display panel. Illustratively, FIG. 1A is a schematically structural diagram of a display panel according to an embodiment of the present application. As shown in FIG. 1A, the display panel 100 includes:

a substrate 101, as well as a plurality of pixel units and a pixel defining layer which are on the substrate 101, wherein the pixel defining layer is used to define pixel regions. One pixel unit is taken as an example in FIG. 1A for illustration. Each pixel unit includes a first electrode, an organic functional layer and a second electrode; and the organic functional layer is in the pixel region corresponding to the pixel unit. Illustratively, as shown in FIG. 1A, the first electrode 102, the organic functional layer 105 and the second electrode 106 are sequentially formed on the substrate. That is, the first electrode 102 is on the substrate, and is in the pixel region; the organic functional layer 105 is on the first electrode 102; and the second electrode 106 is on the organic functional layer 105. Optionally, the second electrodes 106 may form a film cover the entire surface of the substrate 101 on which the first electrodes, the pixel defining layer and the organic functional layers are formed. That is, the second electrodes of the all pixel units are integrated, and are in a form of a whole layer. Each second electrode 106 may also form a film in each pixel region. That is, the second electrode of each pixel unit corresponds to the organic functional layer of the pixel unit, as shown in FIG. 1A.

In the embodiment of the present application, the first electrode and the second electrode are one of an anode and a cathode, respectively. For example, the first electrode is an anode and the second electrode is a cathode, or, the first electrode is a cathode and the second electrode is an anode.

The pixel defining layer includes a first defining layer 103 and a second defining layer 104. The first defining layer 103 is on a side of the second defining layer 104 away from the substrate 101. An orthographic projection of the first defining layer 103 on the substrate 101 covers that of the second defining layer 104 on the substrate 101; and an opening area of the first defining layer 103 is smaller than that of the second defining layer 104 so as to form a groove. As shown in FIG. B, the position of the groove 001 corresponds to a region between the bottom of the first defining layer 103 and a surface of the substrate 101 that is in contact with the second defining layer 104. The groove bottom surface of the groove 001 is one side surface of the second defining layer 104. That is, the groove is a portion of the second defining layer that is recessed relative to the first defining layer in a direction parallel to the substrate. As shown in FIG. 1A, at least a portion of a raised edge of the organic functional layer 105 is in the groove, so that an orthographic projection of at least the portion of the raised edge of the organic functional layer 105 on the substrate 101 falls into the orthographic projection of the first defining layer 103 on the substrate 101.

Figure 1B:
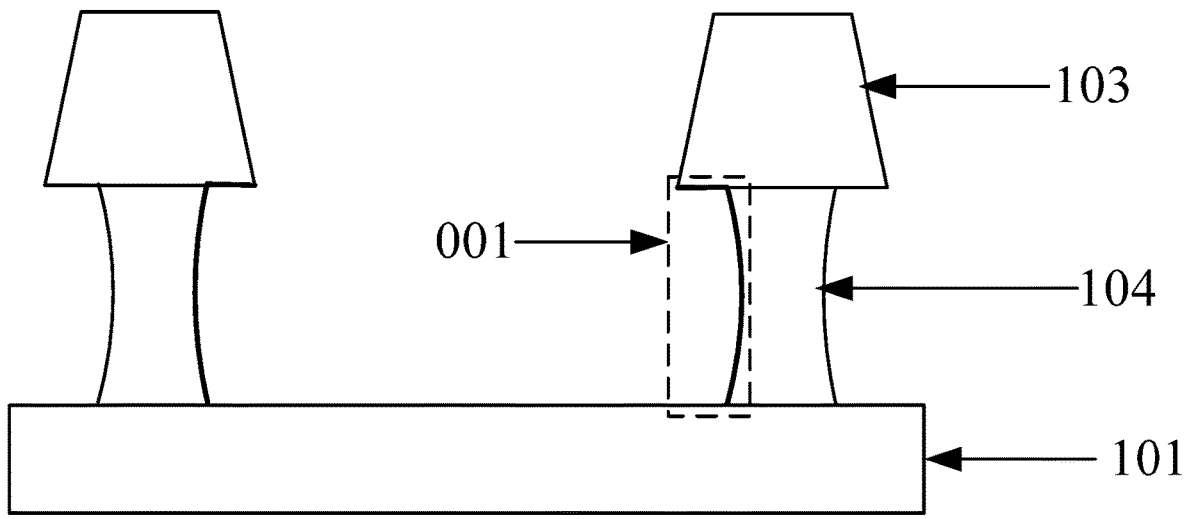
FIG. 1B is a schematic diagram of a groove formed by a first defining layer and a second defining layer provided by an embodiment of the present application.
Figure 1C:
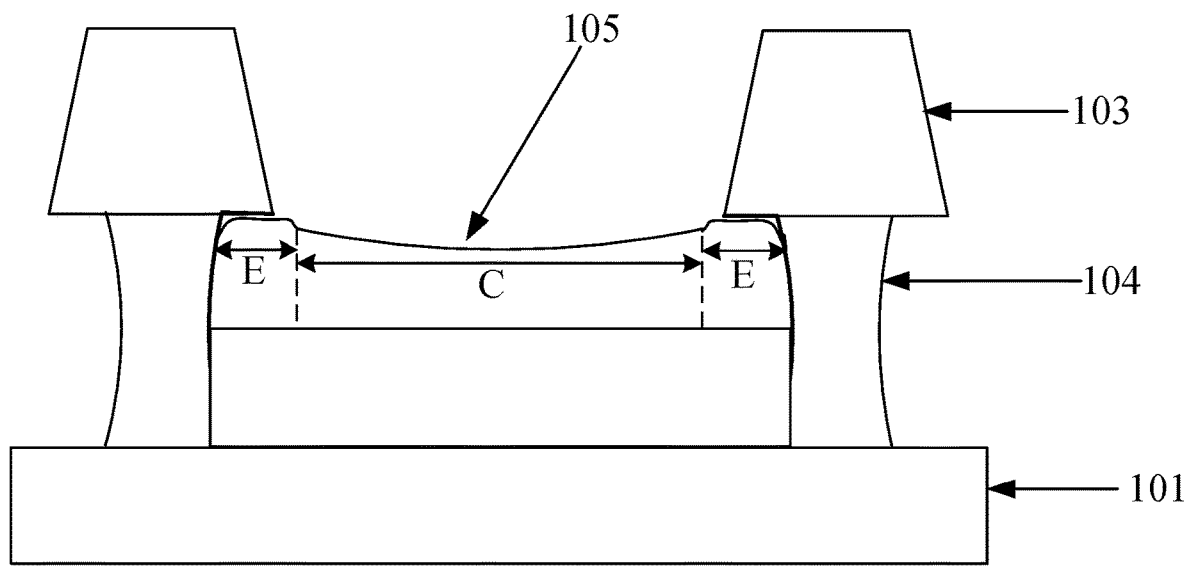
FIG. 1C is a schematic diagram of an edge region and the remaining region of an organic functional layer provided by an embodiment of the present application.

As shown in FIG. 1C, the edge region E of the organic functional layer 105 where the raised edge is located is a region where the organic functional layer 105 is close to the pixel defining layer, and the remaining region C of the organic functional layer 105 is a region except the edge region E of the organic functional layer 105. As shown in FIG. 1A, the thickness h1 of the edge region of the organic functional layer 105 is greater than that of the remaining region of the organic functional layer 105.

Figure 1D:
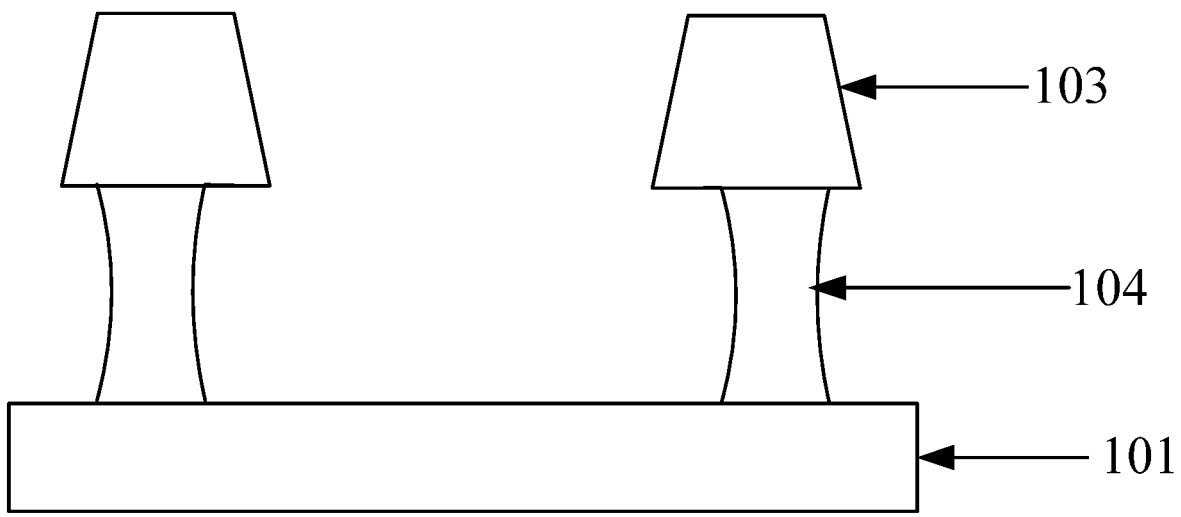
FIG. 1D is a schematically structural diagram of a second defining layer and a first defining layer provided by an embodiment of the present application.

In the embodiment of the present application, the orthographic projection of the first defining layer on the substrate covers the orthographic projection of the second defining layer on the substrate (that is, the area of the orthographic projection of the first defining layer on the substrate is larger than that of the orthographic projection of the second defining layer on the substrate, and the orthographic projection of the second defining layer on the substrate is in the orthographic projection of the first defining layer on the substrate), and the opening area of the first defining layer is smaller than that of the second defining layer so as to form the groove. Illustratively, as shown in FIG. 1B, the orthographic projection of the second defining layer 104 on the substrate 101 may be at the center of the orthographic projection of the first defining layer 103 on the substrate 101. In addition, as shown in FIG. 1D, it is also possible that the orthographic projection of the second defining layer 104 on the substrate 101 is not at the center of the orthographic projection of the first defining layer 103 on the substrate 101.

At least a portion of the raised edge of the organic functional layer formed by the inkjet printing process is in the groove formed by the first defining layer and the second defining layer, so that an orthographic projection of at least the portion of the raised edge of the organic functional layer on the substrate falls into the orthographic projection of the first defining layer on the substrate. During forming of the second electrode, the portion of the first defining layer that protrudes from the second defining layer blocks the second electrode, so that at least the portion of the raised edge of the organic functional layer is not in contact with the second electrode, and thus does not emit light during display. Therefore, both the brightness uniformity and the display effect of the display panel can be improved, and non-uniform brightness of the display panel caused by the "coffee ring" effect can be avoided.

Figure 1E:
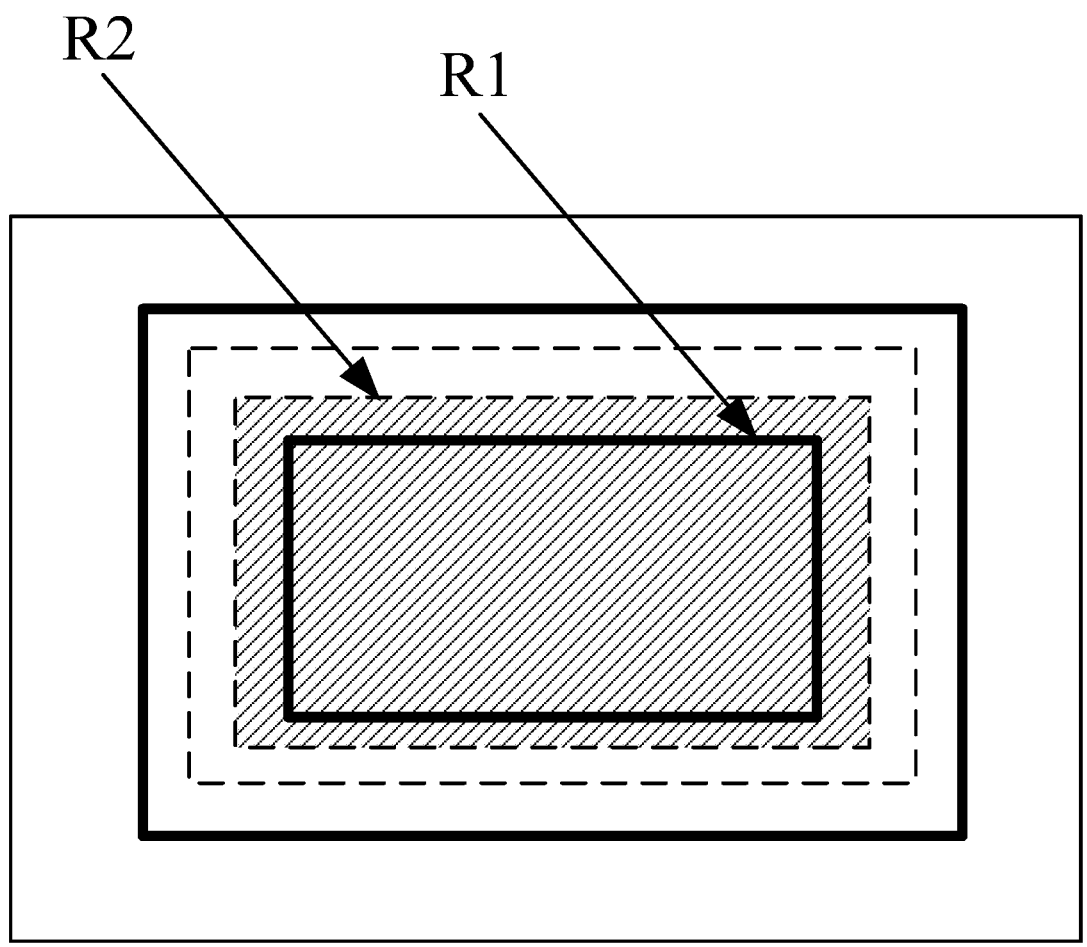
FIG. 1E is a top view of a pixel defining layer provided by an embodiment of the present application.

In the present embodiment, the opening area of the first defining layer is smaller than that of the second defining layer, wherein the position of an opening of the defining layer corresponds to the position of the organic functional layer. FIG. 1E exemplarily shows a top view of a pixel defining layer in an embodiment of the present application. As shown in FIG. 1E, the opening area (i.e., the area of the rectangle R1 in FIG. 1B) of the first defining layer 103 is smaller than the opening area (i.e., the area of the rectangle R2 in FIG. 1B) of the second defining layer 104.

Optionally, the thickness of the second defining layer is not less than the sum of the thickness of the first electrode and the thickness of the organic functional layer. Illustratively, as shown in FIG. 1A, the thickness of the second defining layer 104 may be equal to the sum of the thickness of the first electrode 102 and the thickness of the organic functional layer 105.

Figure 1F:
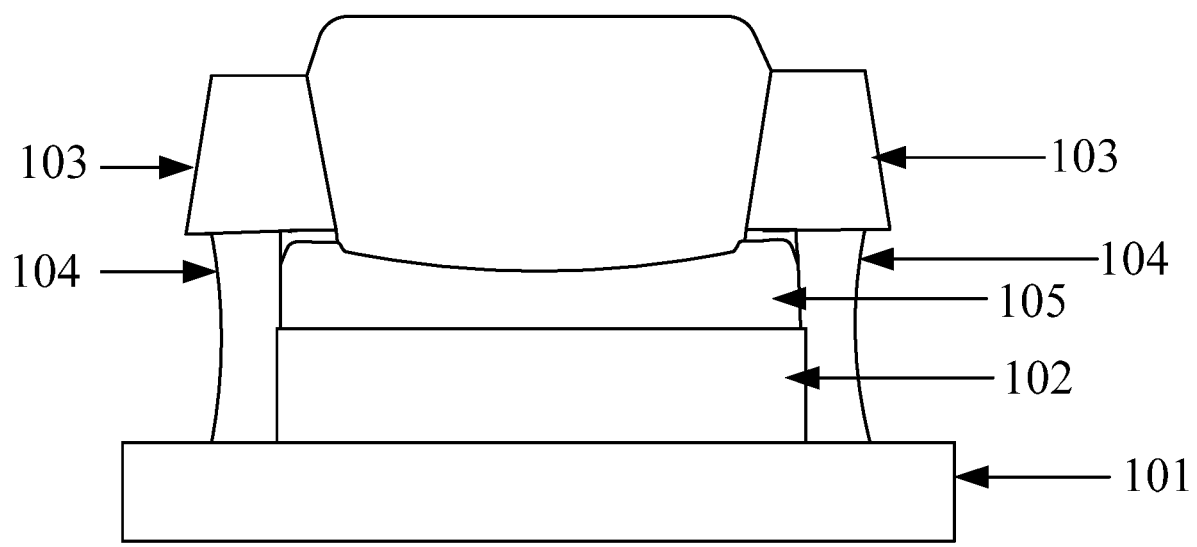
FIG. 1F is a schematically structural diagram of another display panel provided by an embodiment of the present application.

The thickness of the second defining layer may also be greater than the sum of the thickness of the first electrode and the thickness of the organic functional layer. Illustratively, FIG. 1F shows a schematic diagram in which the thickness of the second defining layer 104 is greater than the sum of the thickness of the first electrode 102 and the thickness of the organic functional layer 105. In this case, there is a gap between the top of the organic functional layer 105 and the bottom of the first defining layer 103.

In order to further improve the brightness uniformity of the display panel, illustratively, as shown in FIG. 1A, the orthographic projection of the whole raised edge of the organic functional layer 105 on the substrate 101 may fall into the orthographic projection of the first defining layer 103 on the substrate 101. In this case, the whole raised edge of the organic functional layer is in the groove formed by the first defining layer and the second defining layer. During forming of the second electrode, the portion of the first defining layer that protrudes from the second defining layer blocks the second electrode, so that the whole raised edge of the organic functional layer are not in contact with the second electrode, and thus do not emit light during display. Therefore, the display effect of the display panel is improved.

Optionally, as shown in FIG. 1F, when there is a gap between the top of the organic functional layer 105 and the bottom of the first defining layer 103, the second electrode may also be partially in the groove.

Optionally, the second electrode is outside the groove formed by the first defining layer and the second defining layer. As the second electrode is outside the groove, the entire second electrode is not in contact with at least a portion of the raised edge of the organic functional layer, causing at least the portion of the raised edge of the organic functional layer not to emit light during display.

In the embodiment of the present application, the organic functional layer 105 may include a hole injection layer, a hole transport layer, an organic light-emitting layer, an electron transport layer and an electron injection layer.

Figure 2:
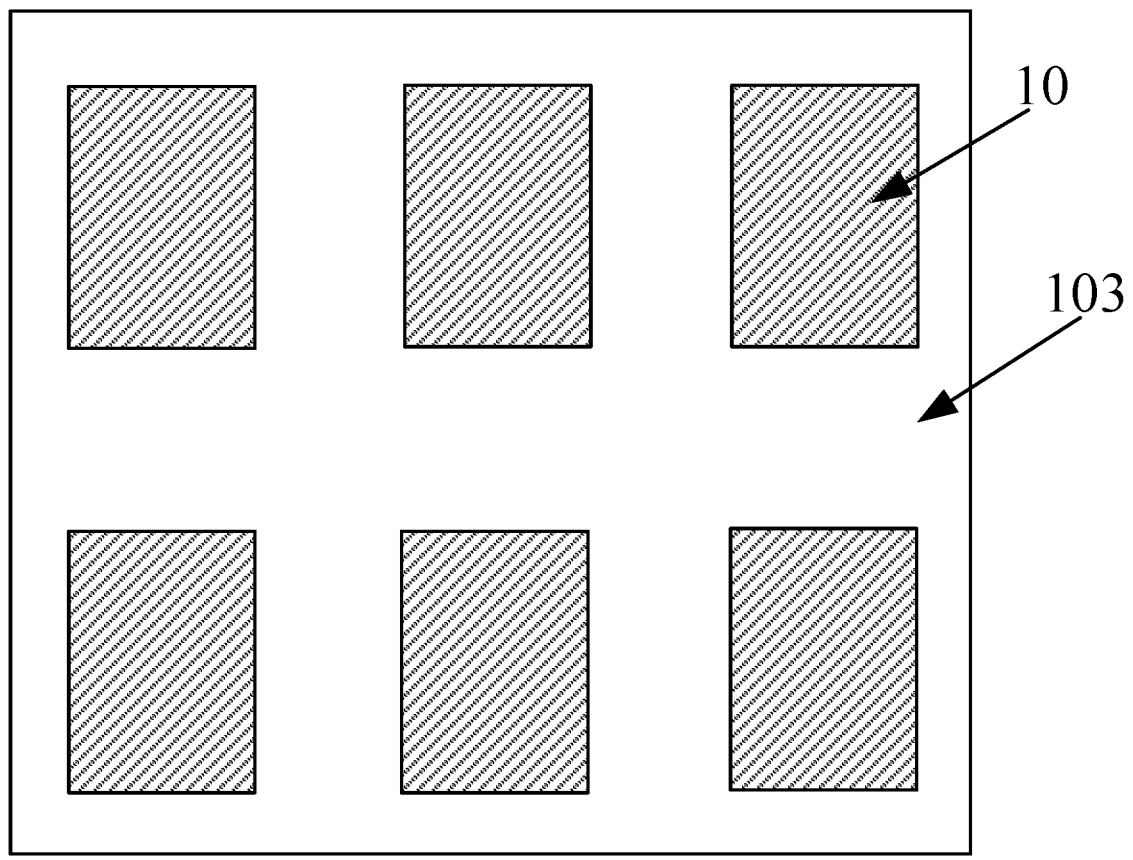
FIG. 2 is a top view of the display panel provided by an embodiment of the present application.

FIG. 2 is a top view of a display panel provided by an embodiment of the present application. As shown in FIG. 2, the periphery of each pixel unit 10 is surrounded by the first defining layer 103 and the second defining layer; and an orthographic projection of at least a portion of the raised edge of the organic functional layer on the substrate falls into the orthographic projection of the first defining layer 103 on the substrate. FIG. 2 exemplarily shows six pixel units, each of which is used to emit one color of light. Illustratively, each pixel unit can emit red, blue or green light.

In the embodiment of the present application, the material of the first defining layer 103 and the material of the second defining layer 104 may be insulating materials. In consideration of the influence of an etching process, in order to form the present defining layer without affecting another defining layer, the material of the first defining layer 103 and the material of the second defining layer 104 are different.

Illustratively, the material of the first defining layer may be polyimide (PI); and the material of the second defining layer may be silicon nitride (SiN) or silicon monoxide (SiO).

Optionally, the material of the first electrode may have a relatively higher conductivity and a relatively higher work function. Illustratively, the material of the first electrode may be indium tin oxide (ITO), antimony-doped tin oxide (ATO), or the like.

Optionally, the material of the second electrode may be a metal. Illustratively, the material of the second electrode may be aluminum.

In summary, the display panel provided by the embodiment of the present application includes the plurality of pixel units and the pixel defining layer which are on the substrate, wherein each pixel unit includes the first electrode, the organic functional layer and the second electrode; and the pixel defining layer includes the first defining layer and the second defining layer which form the groove. At least the portion of the raised edge of the organic functional layer formed by the inkjet printing process is in the groove formed by the first defining layer and the second defining layer, so that the orthographic projection of at least the portion of the raised edge of the organic functional layer on the substrate falls into the orthographic projection of the first defining layer on the substrate. During forming of the second electrode, the portion of the first defining layer that protrudes from the second defining layer blocks the second electrode, so that at least the portion of the raised edge of the organic functional layer is not in contact with the second electrode, and thus does not emit light during display. Therefore, both the brightness uniformity and the display effect of the display panel are improved.

Figure 3A:
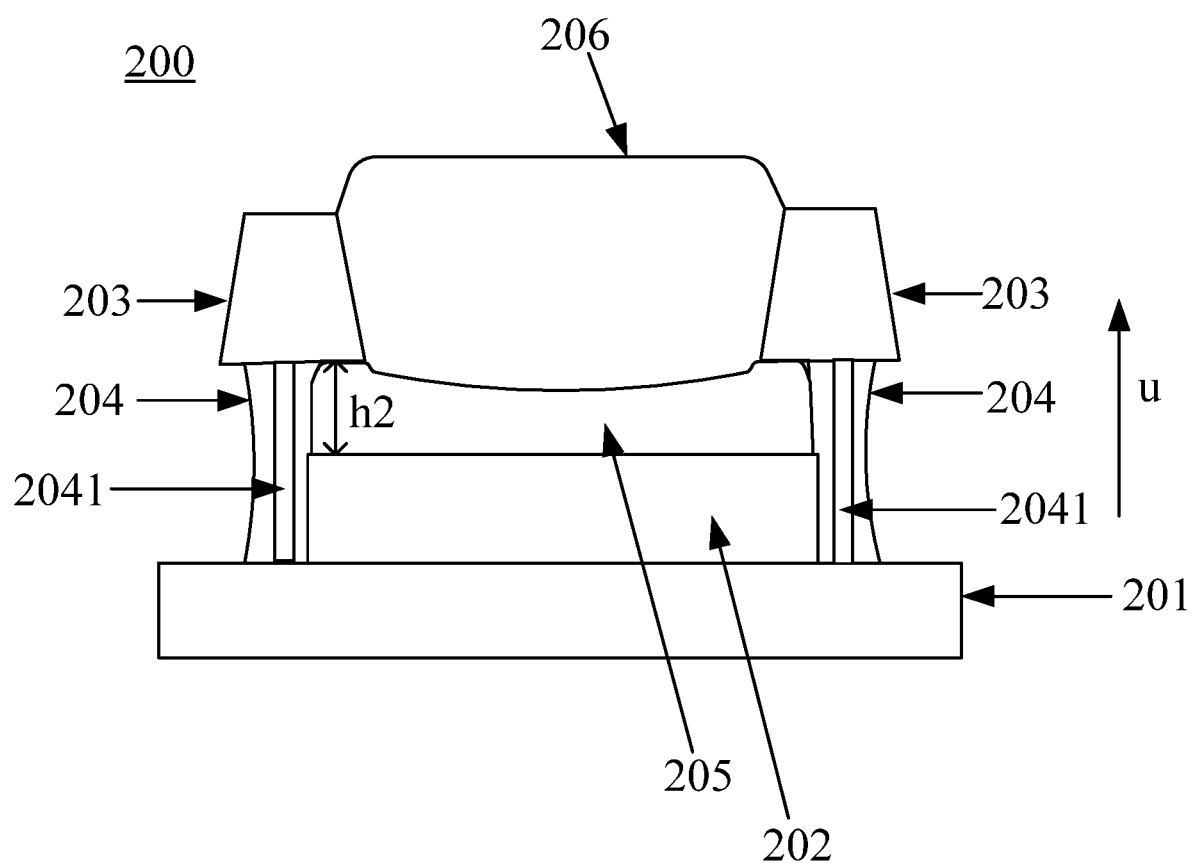
FIG. 3A is a schematically structural diagram of yet another display panel provided by an embodiment of the present application.

FIG. 3A is a schematically structural diagram of yet another display panel provided by an embodiment of the present application. As shown in FIG. 3A, the display panel 200 includes:

a substrate 201, as well as a plurality of pixel units and a pixel defining layer which are on the substrate 201, wherein the pixel defining layer is used to define pixel regions; and one pixel unit is taken as an example in FIG. 3A for illustration. Each pixel unit includes a first electrode 202, an organic functional layer 205 and a second electrode 206. The first electrode 202 and the organic functional layer 205 are in the pixel region. Illustratively, the first electrode 202, the organic functional layer 205 and the second electrode 206 are sequentially formed on the substrate. Optionally, the second electrodes 206 may form a film cover the entire surface of the substrate 201 on which the first electrodes, the pixel defining layer and the organic functional layers are formed. That is, the second electrodes of the all pixel units are integrated, and are in a form of a whole layer. Each second electrode 206 may also form a film in each pixel region. That is, the second electrode of each pixel unit corresponds to the organic functional layer of the pixel unit, as shown in FIG. 3A.

Figure 3B:
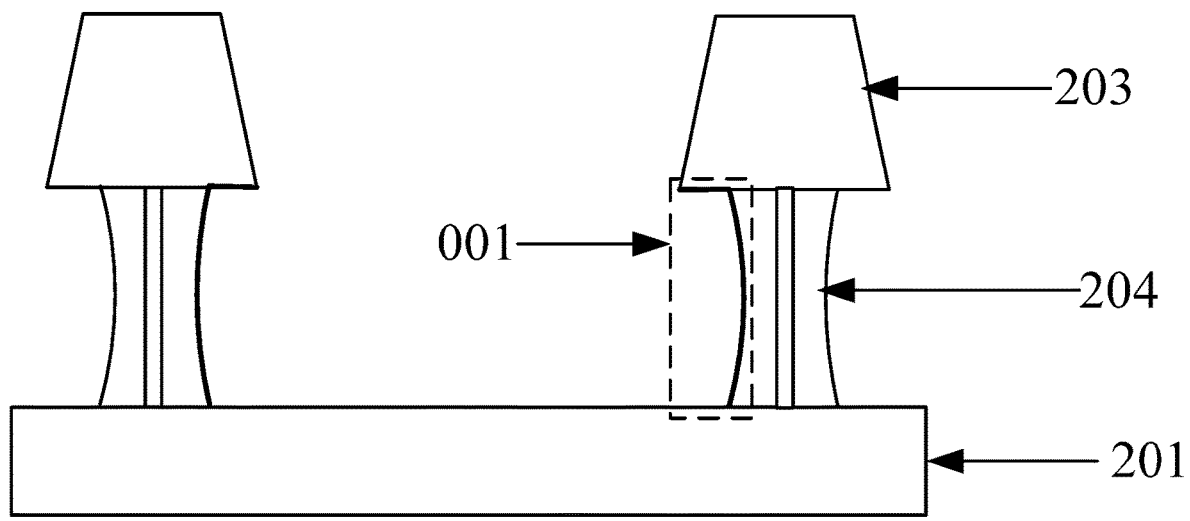
FIG. 3B is a schematic diagram of a groove formed by another first defining layer and another second defining layer provided by an embodiment of the present application.

The pixel defining layer includes a first defining layer 203 and a second defining layer 204. The first defining layer 203 is on a side of the second defining layer 204 away from the substrate 201. An orthographic projection of the first defining layer 203 on the substrate 201 covers that of the second defining layer 204 on the substrate 201; and an opening area of the first defining layer 203 is smaller than that of the second defining layer 204 so as to form a groove. As shown in FIG. 3B, the position of the groove 001 corresponds to a region between the bottom of the first defining layer 203 and a surface of the substrate 201 that is in contact with the second defining layer 204. The groove bottom surface of the groove 001 is the side surface of the second defining layer 204. As shown in FIG. 3A, at least a portion of an raised edge of the organic functional layer 205 is in the groove, so that an orthographic projection of at least the portion of the raised edge of the organic functional layer 205 on the substrate 201 falls into the orthographic projection of the first defining layer 203 on the substrate 201. The thickness $h_2$ of the edge region of the organic functional layer 205 is greater than that of the remaining region of the organic functional layer 205. The remaining region of the organic functional layer is a region except the edge region of the organic functional layer. The schematic diagram of the edge region and the remaining region of the organic functional layer may refer to FIG. 1C.

In the embodiment of the present application, at least a portion of the raised edge of the organic functional layer formed by the inkjet printing process is in the groove formed by the first defining layer and the second defining layer, so that an orthographic projection of at least the portion of the raised edge of the organic functional layer on the substrate falls into the orthographic projection of the first defining layer on the substrate. During forming of the second electrode, the portion of the first defining layer that protrudes from the second defining layer blocks the second electrode, so that at least the portion of the raised edge of the organic functional layer is not in contact with the second electrode, and thus does not emit light during display. Therefore, both the brightness uniformity and the display effect of the display panel are improved.

Optionally, the thickness of the second defining layer is not less than the sum of the thickness of the first electrode and the thickness of the organic functional layer. Illustratively, as shown in FIG. 3A, the thickness of the second defining layer 204 may be equal to the sum of the thickness of the first electrode 202 and the thickness of the organic functional layer 205.

In order to further improve the brightness uniformity of the display panel, illustratively, as shown in FIG. 3A, the orthographic projection of the whole raised edge of the organic functional layer 205 on the substrate 201 may fall into the orthographic projection of the first defining layer 203 on the substrate 201. In this case, the whole raised edge of the organic functional layer are in the groove formed by the first defining layer and the second defining layer, and are not in contact with the second electrode, so that the whole raised edge of the organic functional layer do not emit light during display. Therefore, the display effect of the display panel is improved.

Optionally, the second electrode is outside the groove formed by the first defining layer and the second defining layer. As the second electrode is outside the groove, the entire second electrode is not in contact with at least a portion of the raised edge of the organic functional layer, causing at least the portion of the raised edge of the organic functional layer not to emit light during display.

The organic functional layer includes a hole injection layer, a hole transport layer, an organic light-emitting layer, an electron transport layer and an electron injection layer.

In the embodiment of the present application, the material of the first defining layer 203 may be an insulating material; and the material of the second defining layer 204 may be a conductive material. Illustratively, the material of the first defining layer may be PI; and the material of the second defining layer may be a metal oxide which may be, for example, ITO.

When the material of the second defining layer is a conductive material, illustratively, as shown in FIG. 3A, a conductive isolation region 2041 may be thoroughly formed in the thickness direction (the direction indicated by u in FIG. 3A) of the second defining layer 204, and is used to isolate electrical connections between adjacent pixel units to avoid conduction between the adjacent pixel units. The thickness of the second defining layer is the distance from the upper surface to the lower surface of the second defining layer; the upper and lower surfaces of the second defining layer are parallel to the substrate; the upper surface of the second defining layer is in contact with the first defining layer; and the lower surface of the second defining layer is in contact with the substrate. The thickness direction of the second defining layer is perpendicular to the substrate.

In the embodiment of the present application, the second defining layer made of the conductive material is provided with the conductive isolation region, so that a short circuit phenomenon of the adjacent pixel units caused by the conductivity of the second defining layer can be avoided.

Illustratively, the conductive isolation region may be of a hollow through hole structure.

Illustratively, an insulating material the same as the material of the first defining layer may also be arranged in the hollow through hole structure of the conductive isolation region. That is, the insulating material such as PI used in forming the first defining layer may be formed in the hole through hole structure.

In summary, the display panel provided by the embodiment of the present application includes the plurality of pixel units and the pixel defining layer which are on the substrate, wherein the pixel defining layer includes the first defining layer and the second defining layer which form the groove. The second defining layer made of the conductive material is provided with the conductive isolation region for isolating electrical connections between adjacent pixel units. At least a portion of the raised edge of the organic functional layer formed by the inkjet printing process is in the groove formed by the first defining layer and the second defining layer, so that an orthographic projection of at least the portion of the raised edge of the organic functional layer on the substrate falls into the orthographic projection of the first defining layer on the substrate. During forming of the second electrode, the portion of the first defining layer that protrudes from the second defining layer blocks the second electrode, so that at least the portion of the raised edge of the organic functional layer is not in contact with the second electrode, and thus does not emit light during display. Therefore, both the brightness uniformity and the display effect of the display panel are improved.

The embodiments of the present application further provide a manufacturing method of a display panel. The manufacturing method includes: forming a first defining layer and a second defining layer on a substrate, wherein the first defining layer is on a side of the second defining layer away from the substrate; and the second defining layer and the first defining layer are used to define pixel regions. An orthographic projection of the first defining layer on the substrate covers an orthographic projection of the second defining layer on the substrate, and an opening area of the first defining layer is smaller than that of the second defining layer so as to form the groove. At least a portion of an raised edge of an organic functional layer of a pixel unit can be in the groove, so that an orthographic projection of at least the portion of the raised edge of the organic functional layer on the substrate falls into the orthographic projection of the first defining layer on the substrate.

The pixel unit includes a first electrode, an organic functional layer and a second electrode. Illustratively, the first electrode, the organic functional layer and the second electrode are sequentially formed on the substrate. Or, the second electrode, the organic functional layer and the first electrode are sequentially formed on the substrate. The manufacturing method of the display panel provided by the embodiment of the present application will be described below by taking an example in which the first electrode, the organic functional layer and the second electrode are sequentially formed on the substrate.

Figure 4:
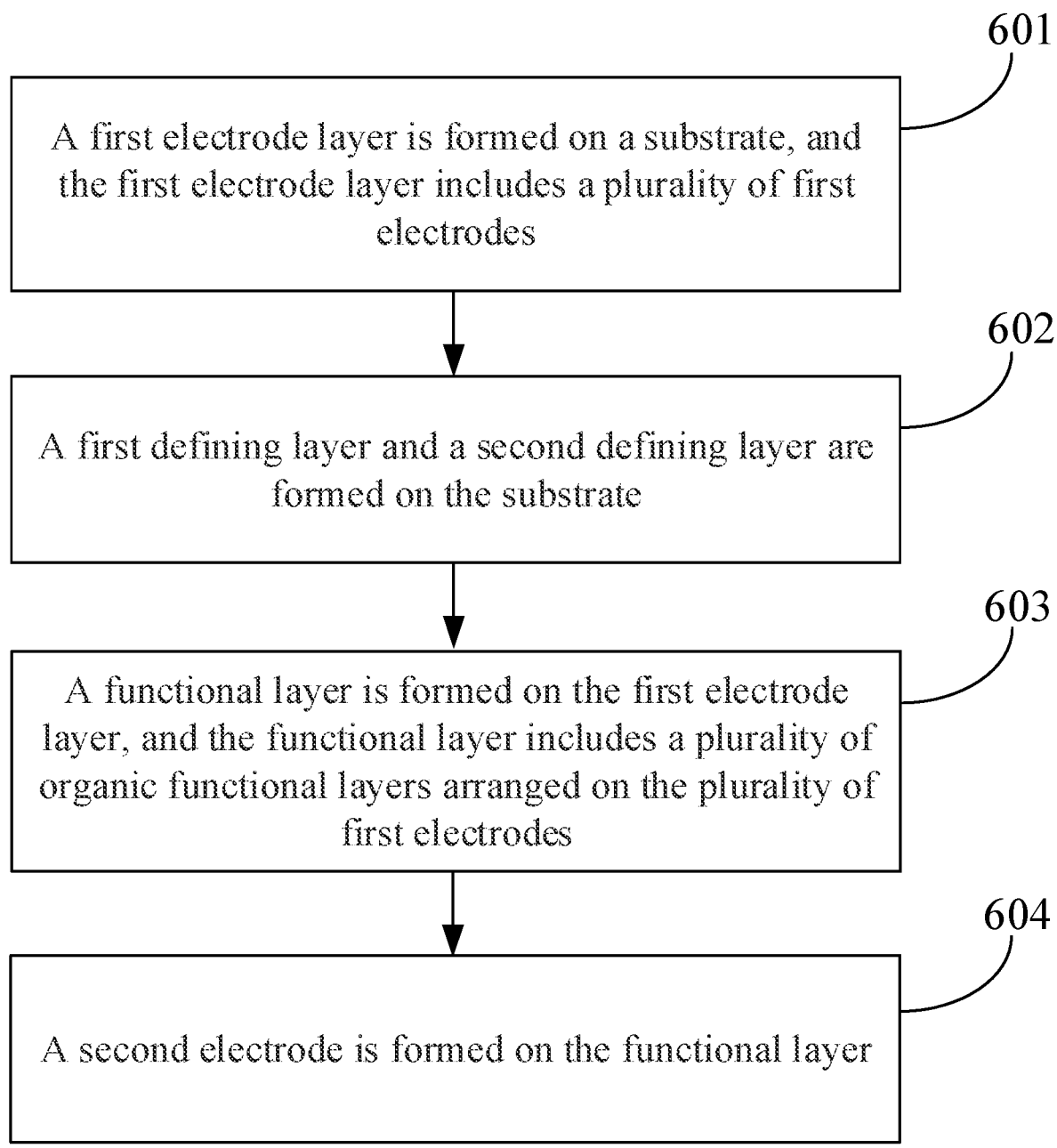
FIG. 4 is a flow chart of a manufacturing method of a display panel provided by an embodiment of the present application.

FIG. 4 is a flow chart of the manufacturing method of the display panel provided by an embodiment of the present application. As shown in FIG. 4, the manufacturing method includes the follows steps.

In step 601, a first electrode layer is formed on a substrate, and the first electrode layer includes a plurality of first electrodes.

Each first electrode is in a pixel region.

In step 602, a first defining layer and a second defining layer are formed on the substrate. The first defining layer and the second defining layer are used to define the pixel regions. The first defining layer is on a side of the second defining layer away from the substrate. An orthographic projection of the first defining layer on the substrate covers an orthographic projection of the second defining layer on the substrate, and an opening area of the first defining layer is smaller than that of the second defining layer so as to form a groove.

The orthographic projection of the first defining layer on the substrate covers the orthographic projection of the second defining layer on the substrate. That is, the area of the orthographic projection of the first defining layer on the substrate is greater than that of the orthographic projection of the second defining layer on the substrate, and the orthographic projection of the second defining layer on the substrate is in the orthographic projection of the first defining layer on the substrate.

In the embodiment of the present application, both the material of the first defining layer and the material of the second defining layer may be insulating materials.

In step 603, a functional layer is formed on the first electrode layer, and the functional layer includes a plurality of organic functional layers arranged on the plurality of first electrodes.

The plurality of organic functional layers is in one-to-on correspondence with the plurality of first electrodes. The organic functional layer is in the pixel region. At least a portion of an raised edge of the organic functional layer is in a groove formed by the first defining layer and the second defining layer; and an orthographic projection of at least the portion of the raised edge of each organic functional layer on the substrate falls into an orthographic projection of the first defining layer at the periphery of the corresponding first electrode on the substrate. The thickness of the edge region of the organic functional layer is greater than that of the remaining region of the organic functional layer.

In step 603, a functional layer is formed by adopting an inkjet printing process.

Optionally, the organic functional layer may include a hole injection layer, a hole transport layer, an organic light emitting layer, an electron transport layer and an electron injection layer.

In step 604, a second electrode is formed on the functional layer.

Optionally, the second electrodes may form a film on the entire surface of the substrate on which the first electrodes, a first defining layer, a second defining layer and the functional layer are formed. That is, the second electrodes of the all pixel units are integrated, and are in a form of a whole layer. Each second electrode may also form a film in each pixel region. That is, the second electrode of each pixel unit corresponds to the organic functional layer of the pixel unit.

When the second electrodes form the film on the entire surface of the substrate on which the first electrodes, a first defining layer, a second defining layer and the functional layer are formed, step 604 may include: forming an whole second electrode layer on the functional layer.

When each second electrode forms the film in each pixel region, step 604 may include: forming a plurality of second electrodes on the functional layer, wherein the second electrodes are arranged on the plurality of organic functional layers in a one-to-one correspondence.

In the embodiment of the present application, at least the portion of the edge region of the organic functional layer formed by the inkjet printing process is in the groove formed by the first defining layer and the second defining layer; and the orthographic projection of at least the portion of the raised edge of the organic functional layer on the substrate falls into the orthographic projection of the first defining layer on the substrate. During forming of the second electrode, the portion of the first defining layer that protrudes from the second defining layer blocks the second electrode, so that at least the portion of the raised edge of the organic functional layer is not in contact with the second electrode, and thus does not emit light during display. Therefore, the brightness uniformity of the display panel can be improved, a display effect of the display panel is improved, and non-uniform brightness of the display panel caused by the "coffee ring" effect can be avoided.

Optionally, the thickness of the second defining layer is not less than the sum of the thickness of each first electrode and the thickness of the corresponding organic functional layer.

In order to further improve the brightness uniformity of the display panel, the orthographic projection of the whole raised edge of each organic functional layer on the substrate may fall into the orthographic projection of the first defining layer at the periphery of the corresponding first electrode on the substrate. That is, the whole raised edge of the organic functional layer are in the groove formed by the first defining layer and the second defining layer, and are not in contact with the second electrode, so that the whole raised edge of the organic functional layer do not emit light during display.

Figure 5:
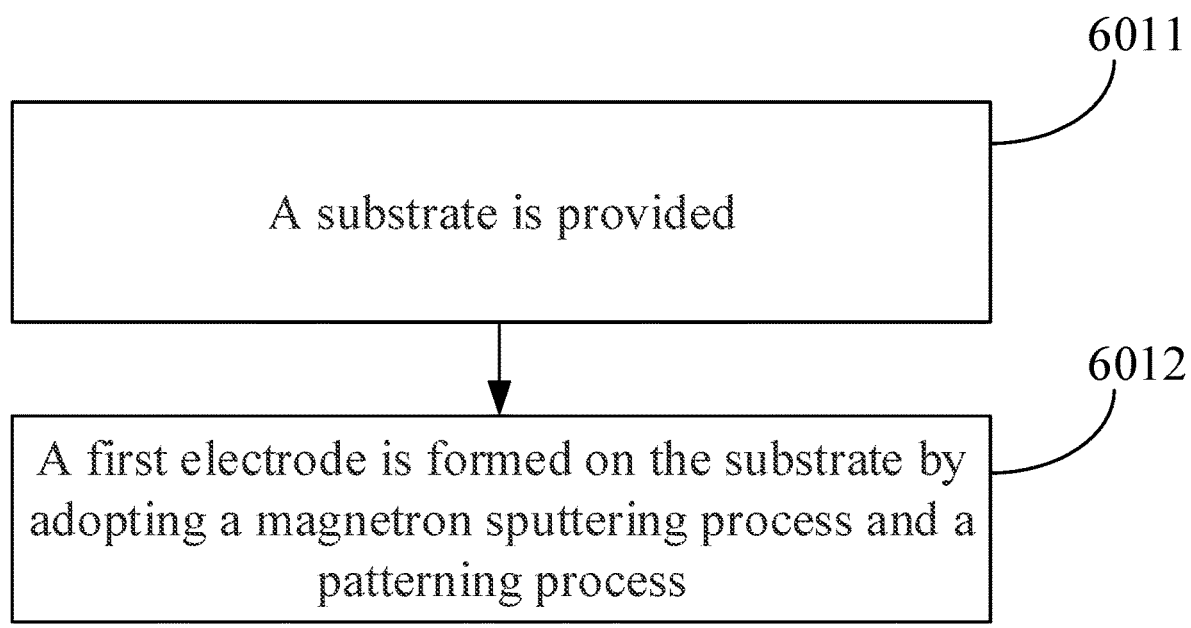
FIG. 5 is a flow chart showing the formation of a first electrode layer in the embodiment shown in FIG. 4.

Optionally, FIG. 5 is a flow chart of forming a first electrode layer on a substrate in step 601 provided by the embodiment of the present application. As shown in FIG. 5, the process may include the following steps.

In step 6011, a substrate is provided.

In step 6012, a first electrode layer is formed on the substrate by adopting a magnetron sputtering process and a patterning process.

A first electrode thin film layer is formed on the substrate by adopting the magnetron sputtering process, and then, the first electrode thin film layer is patterned to obtain the first electrode layer. The patterning process mainly includes: coating the first electrode thin film layer with a photoresist; exposing the photoresist-coated substrate through a mask; developing and etching the exposed substrate to obtain the first electrode layer; and stripping the photoresist.

Illustratively, the material of the first electrode layer may be a material having a relatively high conductivity and a relatively high work function, and for example, may be ITO or ATO.

Figure 6:
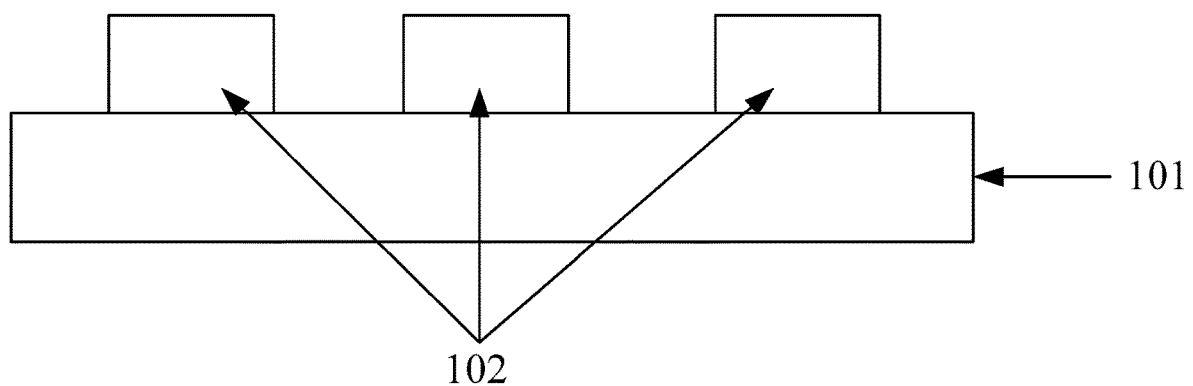
FIG. 6 is a schematically structural diagram of a formed first electrode layer in the embodiment shown in FIG. 4.

FIG. 6 is a schematically structural diagram of forming a first electrode layer on a substrate according to an embodiment of the present application. As shown in FIG. 6, the first electrode layer is formed on the substrate 101 by adopting a magnetron sputtering process and a patterning process, and the first electrode layer includes a plurality of first electrodes 102, each of which is in a pixel region.

Figure 7:
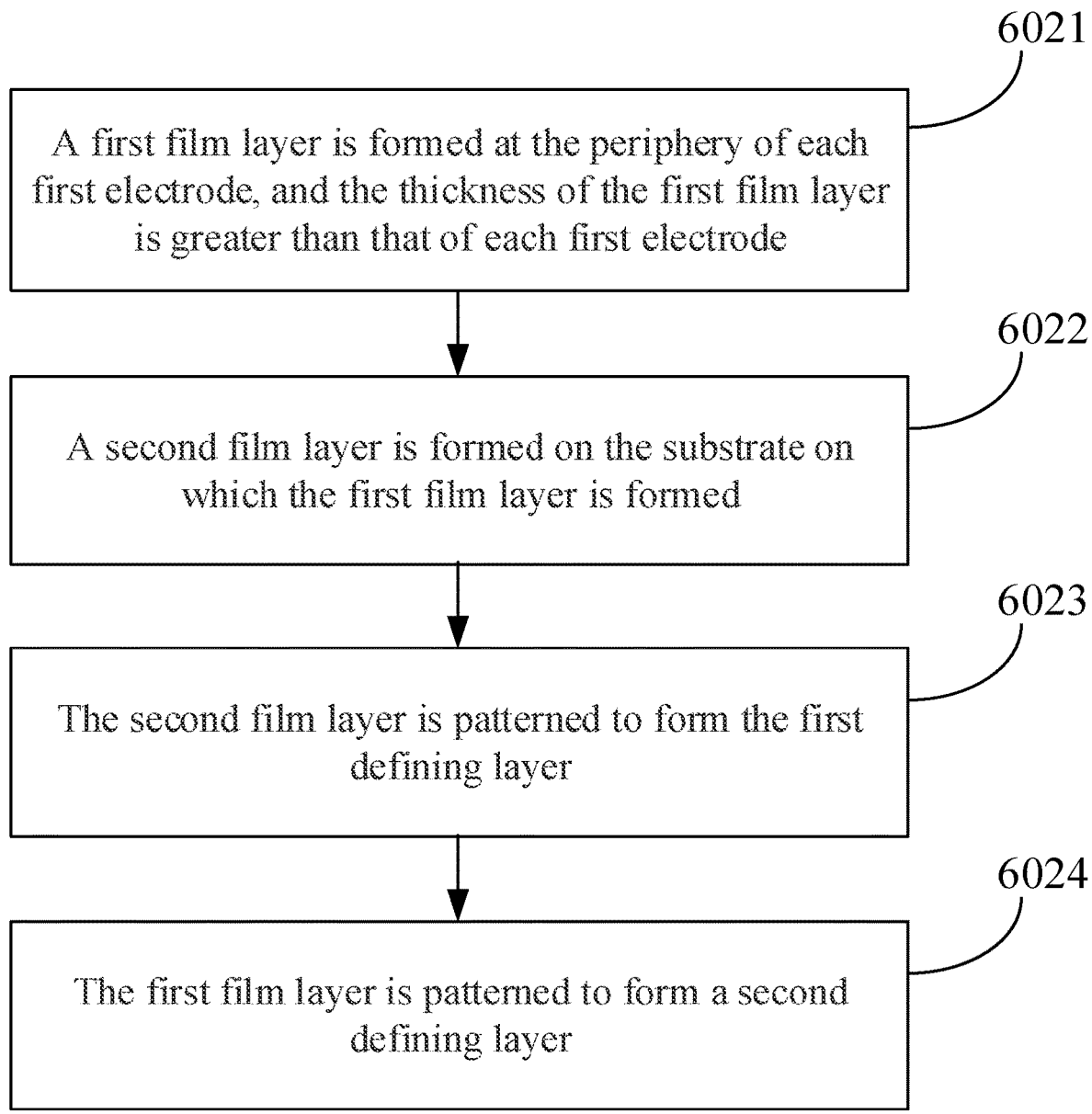
FIG. 7 is a flow chart showing the formation of a first defining layer and a second defining layer in the embodiment shown in FIG. 4.

Optionally, FIG. 7 is a flow chart of forming a first defining layer and a second defining layer on the substrate in step 602 provided by the embodiment of the present application. As shown in FIG. 7, the process may include the following steps.

In step 6021, a first film layer is formed at the periphery of each first electrode, and the thickness of the first film layer is greater than that of each first electrode.

In step 6021, the first film layer is formed at the periphery of each first electrode, and the first film layer covers the first electrode layer. Optionally, the material of the first film layer may be an insulating material. Illustratively, the insulating material may be SiN or SiO.

In step 6022, a second film layer is formed on the substrate on which the first film layer is formed.

The material of the second film layer is an insulating material which may be, for example, PI.

In step 6023, the second film layer is patterned to form the first defining layer.

The patterning process mainly includes steps of coating a photoresist, exposing, developing, etching, stripping the photoresist, and the like.

In step 6023, the second film layer may be patterned by adopting a dry etching manner to form the first defining layer.

In step 6024, the first film layer is patterned to form a second defining layer.

In step 6024, the first film layer may be patterned by adopting a wet etching manner to form the second defining layer. After forming the second defining layer, the first film layer is exposed in the opening area of the second defining layer. At this time, the first film layer is etched by spraying an etchant on the first film layer; and the required second defining layer is formed by controlling a reaction time.

Optionally, each second electrode is outside of a groove at the periphery of the corresponding first electrode. As the second electrode is outside the groove, the entire second electrode is not in contact with at least a portion of the raised edge of the organic functional layer, causing at least the portion of the raised edge of the organic functional layer not to emit light during display.

Figure 8:
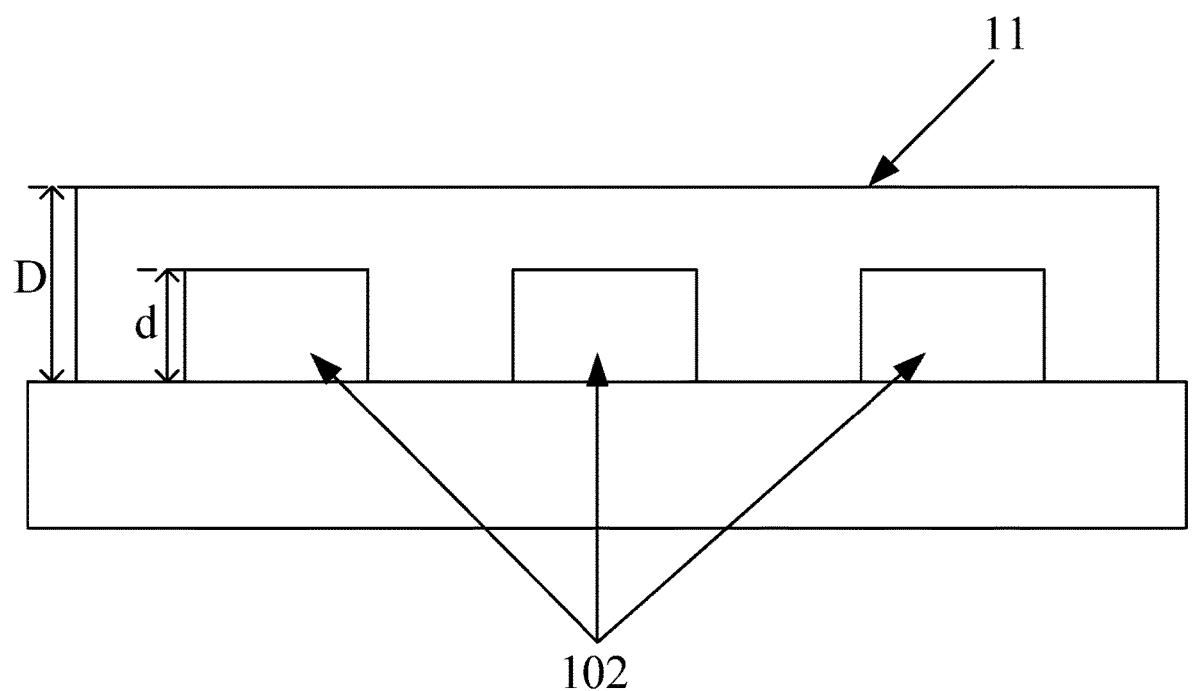
FIG. 8 is a schematically structural diagram of a formed first film layer in the embodiment shown in FIG. 4.

FIGS. 8 to 13 are schematically structural diagrams of a display panel manufactured in accordance with the above method in the present application. Illustratively, FIG. 8 is a schematically structural diagram of a first film layer formed at the periphery a first electrode provided by an embodiment of the present application. As shown in FIG. 8, a first film layer 11 is formed at the periphery of each first electrode 102, and the first film layer 11 covers the first electrode layer; and the thickness D of the first film layer 11 is greater than the thickness d of each first electrode 102.

Figure 9:
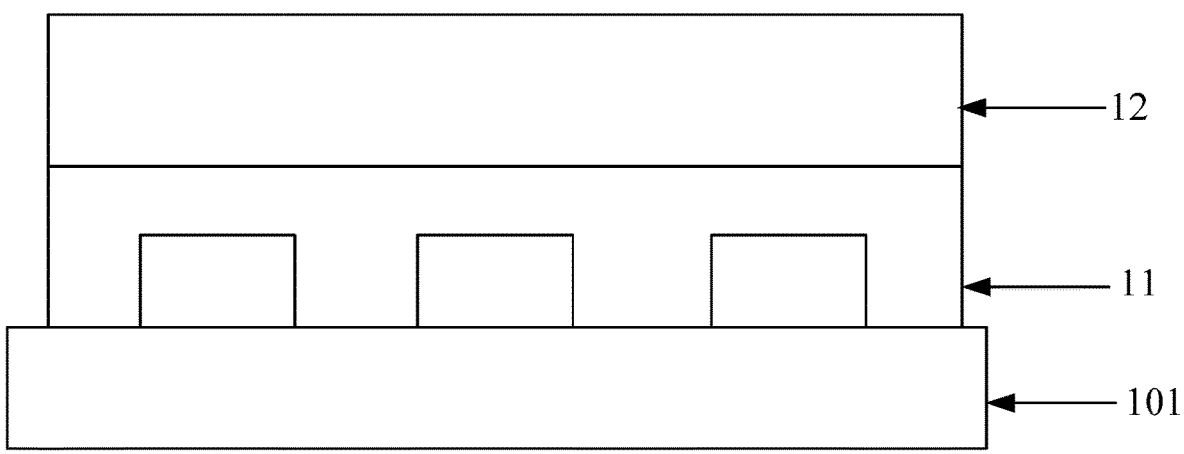
FIG. 9 is a schematically structural diagram of a formed second film layer in the embodiment shown in FIG. 4.

Illustratively, FIG. 9 is a schematically structural diagram of a second film layer formed on a substrate on which the first film layer is formed provided by an embodiment of the present application. As shown in FIG. 9, the second film layer 12 is formed on the substrate 101 on which the first film layer 11 is formed.

Figure 10:
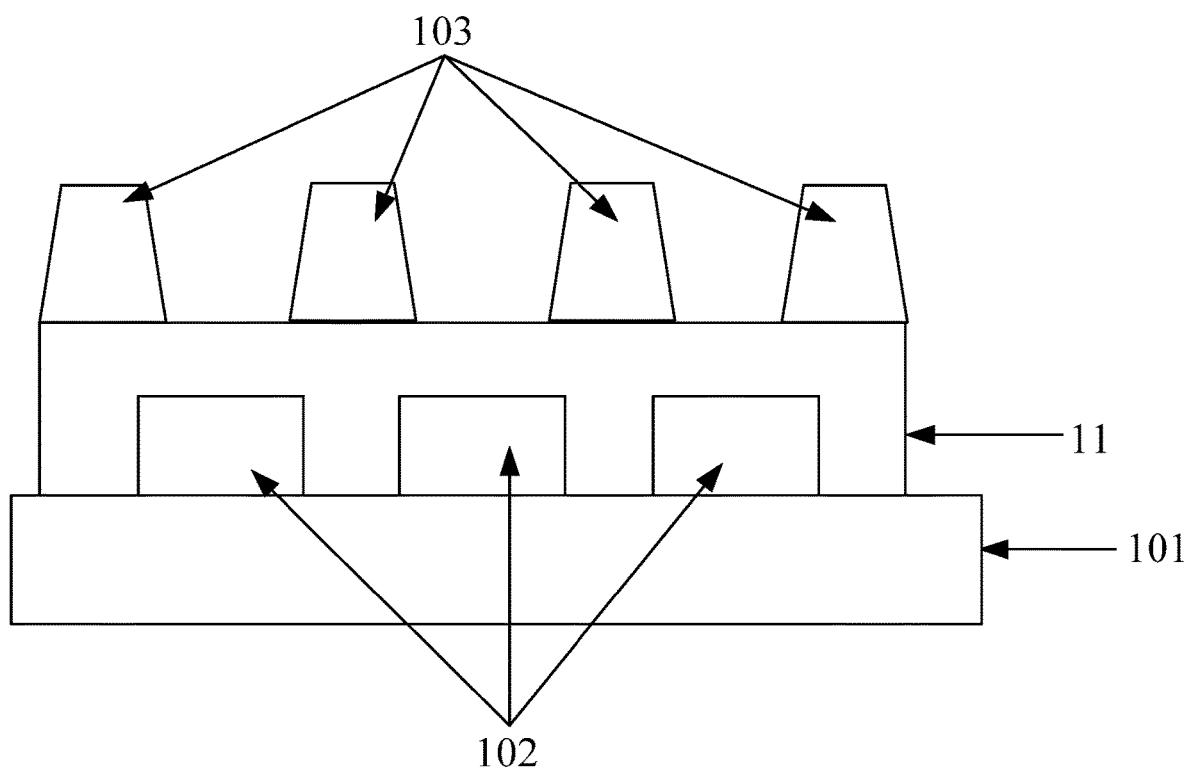
FIG. 10 is a schematically structural diagram of a formed first defining layer in the embodiment shown in FIG. 4.

Illustratively, FIG. 10 is a schematically structural diagram of a first defining layer formed by patterning the second film layer provided by an embodiment of the present application. For example, the schematically structural diagram of the first defining layer 103 formed by patterning the second film layer 12 shown in FIG. 9 may be as shown in FIG. 10.

Figure 11:
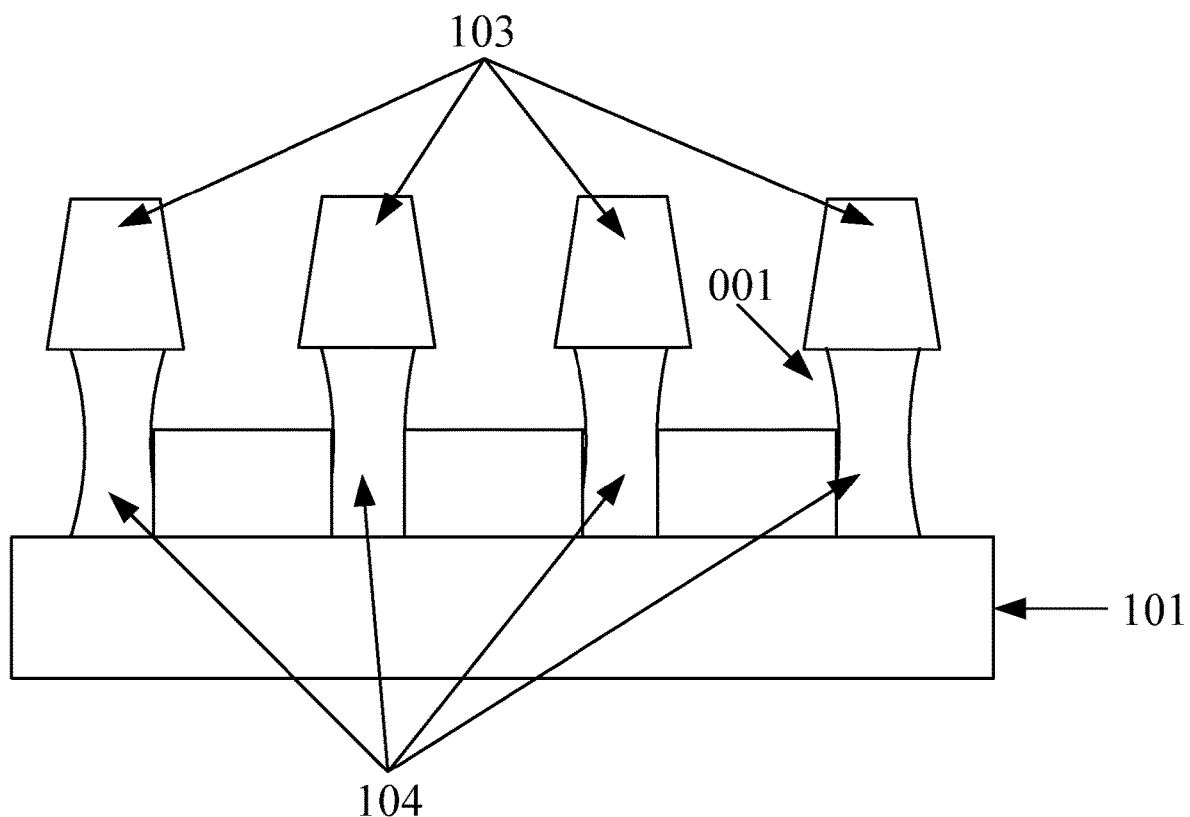
FIG. 11 is a schematically structural diagram of a formed second defining layer in the embodiment shown in FIG. 4.

Illustratively, FIG. 11 is a schematically structural diagram of a second defining layer formed by patterning the first film layer provided by an embodiment of the present application. For example, the schematically structural diagram of the second defining layer 104 formed by patterning the first film layer 11 shown in FIG. 10 may be as shown in FIG. 11. The formed first defining layer 103 is on a side of the second defining layer 104 away from the substrate 101. An orthographic projection of the first defining layer 103 on the substrate 101 covers that of the second defining layer 104 on the substrate 101; and an opening area of the first defining layer 103 is smaller than that of the second defining layer 104 so as to form a groove 001.

Figure 12:
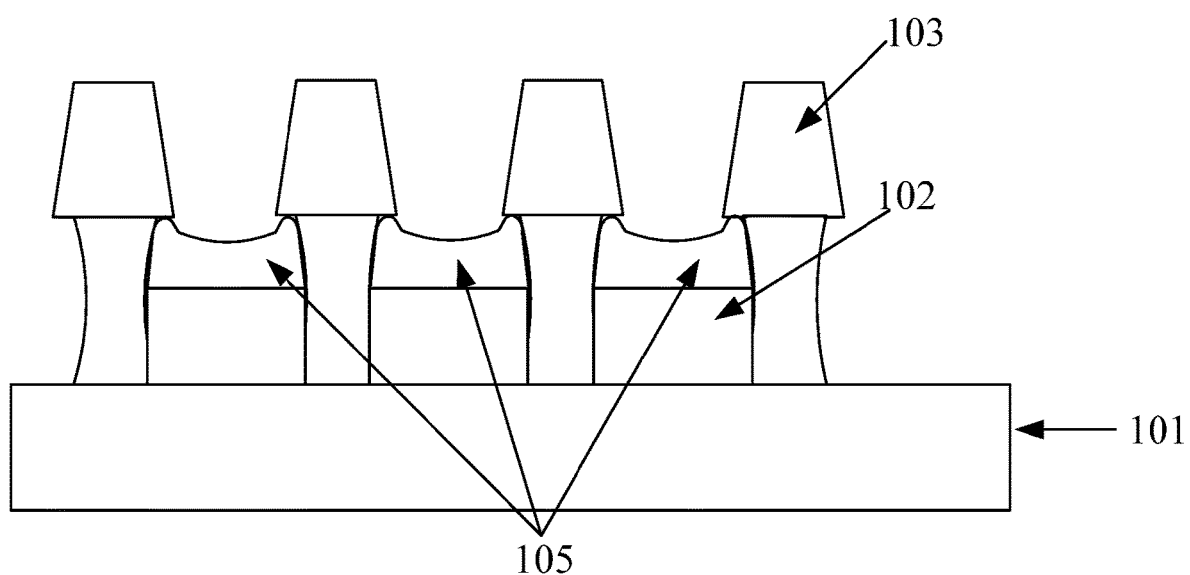
FIG. 12 is a schematically structural diagram of a formed functional layer in the embodiment shown in FIG. 4.

FIG. 12 is a schematically structural diagram of a functional layer formed on the first electrode layer shown in FIG. 11. As shown in FIG. 12, the functional layer includes a plurality of organic functional layers 105 which is arranged on the plurality of first electrodes 102 and which is in one-to-one correspondence with the plurality of first electrodes 102. At least a portion of the raised edge of the organic functional layer 105 is in the groove; and an orthographic projection of at least the portion of the raised edge of each organic functional layer 105 on the substrate 101 falls into an orthographic projection of the first defining layer 103 at the periphery of the corresponding first electrode 102 on the substrate 101. The thickness of the edge region of the organic functional layer 105 is greater than that of the remaining region of the organic functional layer 105.

Figure 13:
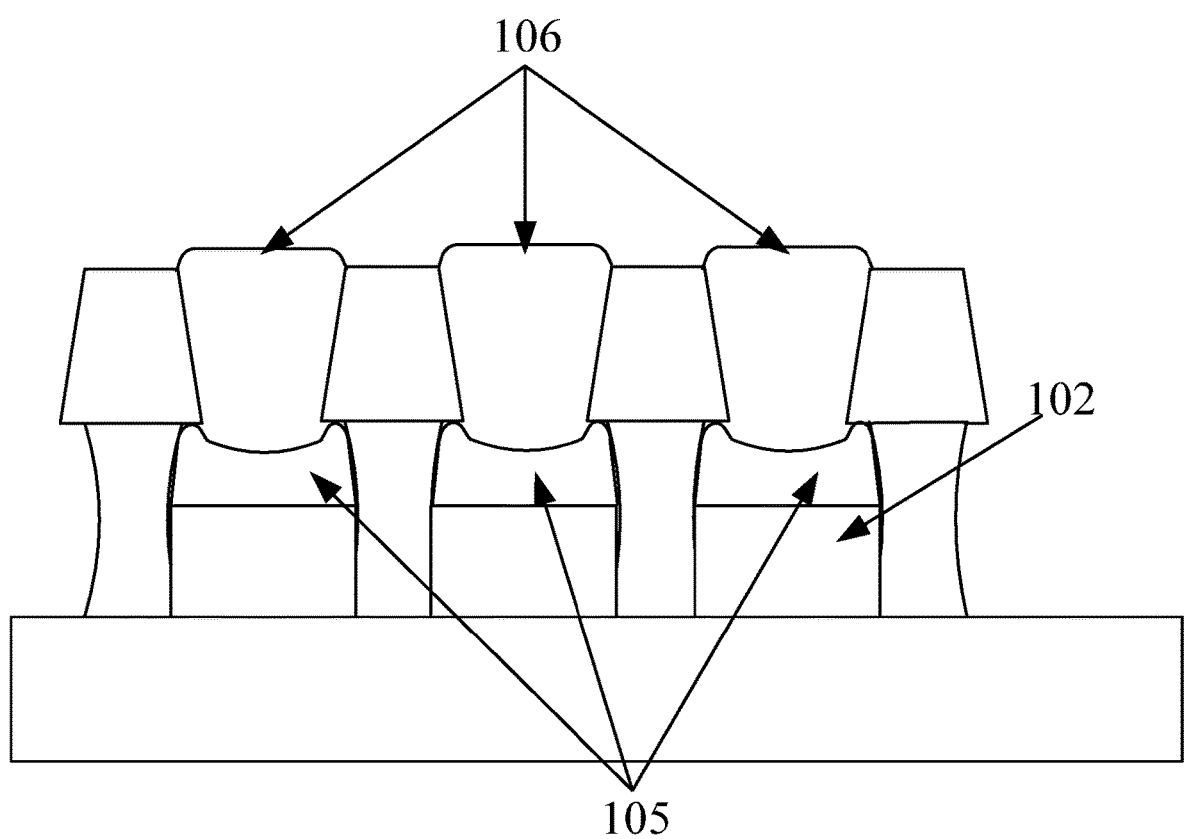
FIG. 13 is a schematically structural diagram of a formed second electrode in the embodiment shown in FIG. 4.

FIG. 13 is a schematically structural diagram of a second electrode formed on the functional layer shown in FIG. 12. Illustratively, as shown in FIG. 13, a plurality of second electrodes 106 arranged on the plurality of organic functional layers 105 in a one-to-one corresponding manner is formed on the functional layer. Each second electrode 106 may be outside a groove at the periphery of the corresponding first electrode 102.

The manufacturing method of the display panel provided by the embodiment of the present application eliminates the "coffee ring" effect without changing a flow of the original inkjet printing process, may avoid non-uniform brightness of the display panel caused by the "coffee ring" effect, and is relatively simple.

In summary, in the manufacturing method of the display panel provided by the embodiment of the present application, the first defining layer and the second defining layer are formed on the substrate, and form the groove. The functional layer formed on the first electrode layer includes the plurality of organic functional layers; and at least the portion of the raised edge of the organic functional layer is in the groove formed by the first defining layer and the second defining layer. The orthographic projection of at least the portion of the raised edge of each organic functional layer on the substrate falls into the orthographic projection of the first defining layer at the periphery of the corresponding first electrode on the substrate. During forming of the second electrode, the portion of the first defining layer that protrudes from the second defining layer blocks the second electrode, so that at least the portion of the raised edge of the organic functional layer is not in contact with the second electrode, and thus does not emit light during display. Therefore, both the brightness uniformity and the display effect of the display panel are improved.

Figure 14:
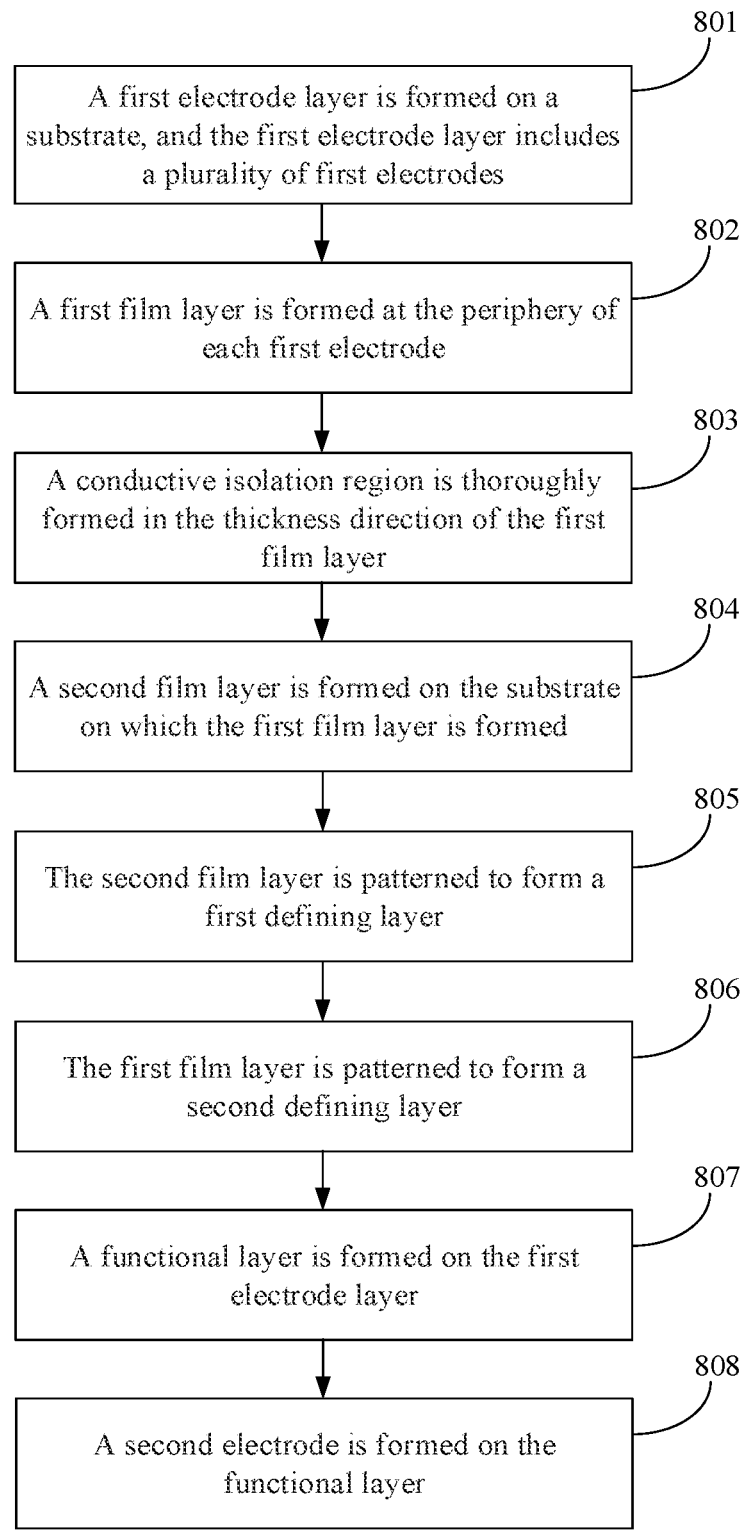
FIG. 14 is a flow chart of a manufacturing method of another display panel provided by an embodiment of the present application.

FIG. 14 is a flow chart of a manufacturing method of another display panel provided by an embodiment of the present application. As shown in FIG. 14, the manufacturing method includes the follows steps.

In step 801, a first electrode layer is formed on a substrate, and the first electrode layer includes a plurality of first electrodes.

Each first electrode is in a pixel region.

In step 802, a first film layer is formed at the periphery of each first electrode.

The first film layer covers the first electrode layer; and the thickness of the first film layer is greater than that of each first electrode.

Optionally, the first film layer is made of a conductive material. Illustratively, the material of the first film layer may be a metal oxide which is, for example, ITO.

In step 803, a conductive isolation region is thoroughly formed in the thickness direction of the first film layer.

The thickness of the first film layer is a distance from the upper surface to the lower surface of the first film layer; and the upper and lower surfaces of the first film layer are parallel to the substrate. The thickness direction of the first film layer is perpendicular to the substrate.

The conductive isolation region is used to isolate electrical connections between adjacent pixel units. The pixel unit includes a first electrode, an organic functional layer and a second electrode. A second defining layer made of a conductive material is provided with the conductive isolation region, so that a short circuit phenomenon of the adjacent pixel units caused by the conductivity of the second defining layer may be avoided.

Optionally, the step 803 may include: thoroughly forming a through hole in the thickness direction of the first film layer by adopting a punching technique to obtain the conductive isolation region which may be of a hollow through hole structure. A patterning process may be employed when punching is performed by adopting the punching technique.

In step 804, a second film layer is formed on the substrate on which the first film layer is formed.

The material of the second film layer is an insulating material which may be, for example, PI.

Optionally, step 804 may include: depositing an insulating material on the substrate on which the first film layer is formed to form the second film layer on the first film layer, and filling the hollow through hole structure with the insulating material.

In the embodiment of the present application, after the conductive isolation region is formed by adopting the punching technique, the top of the hollow through hole structure may also be sealed. In this case, when the second film layer is formed, the hollow through hole structure is not filled with the insulating material of the second film layer.

In step 805, the second film layer is patterned to form a first defining layer.

In step 805, the second film layer may be patterned by adopting a dry etching manner to form the first defining layer.

In step 806, the first film layer is patterned to form a second defining layer.

The first defining layer is on a side of the second defining layer away from the substrate. An orthographic projection of the first defining layer on the substrate covers that of the second defining layer on the substrate; and an opening area of the first defining layer is smaller than that of the second defining layer so as to form a groove.

In step 806, the first film layer may be patterned by adopting a wet etching manner to form a second defining layer.

In step 807, a functional layer is formed on the first electrode layer.

The functional layer includes a plurality of organic functional layers which is arranged on the plurality of first electrodes and which is in one-to-one correspondence with the plurality of first electrodes 102. The organic functional layer is in the pixel region. At least a portion of the raised edge of the organic functional layer is in the groove; and an orthographic projection of at least a portion of the raised edge of each organic functional layer on the substrate falls into an orthographic projection of the first defining layer at the periphery of the corresponding first electrode on the substrate. The thickness of the edge region of the organic functional layer is greater than that of the remaining region of the organic functional layer.

Optionally, the thickness of the second defining layer is not less than the sum of the thickness of the first electrode and the thickness of the corresponding organic functional layer.

In order to further improve the brightness uniformity of the display panel, illustratively, the orthographic projection of the whole raised edge of the organic functional layer on the substrate may fall into the orthographic projection of the first defining layer on the substrate. In this case, the whole raised edge of the organic functional layer are in the groove formed by the first defining layer and the second defining layer, and are not in contact with the second electrode, so that the whole raised edge of the organic functional layer do not emit light during display. Therefore, the display effect of the display panel is improved.

In step 808, a second electrode is formed on the functional layer.

Optionally, a plurality of second electrodes arranged on the plurality of organic functional layers in a one-to-one corresponding manner is formed on the functional layer; and each second electrode may be outside the groove at the periphery of the corresponding first electrode.

Figure 15:
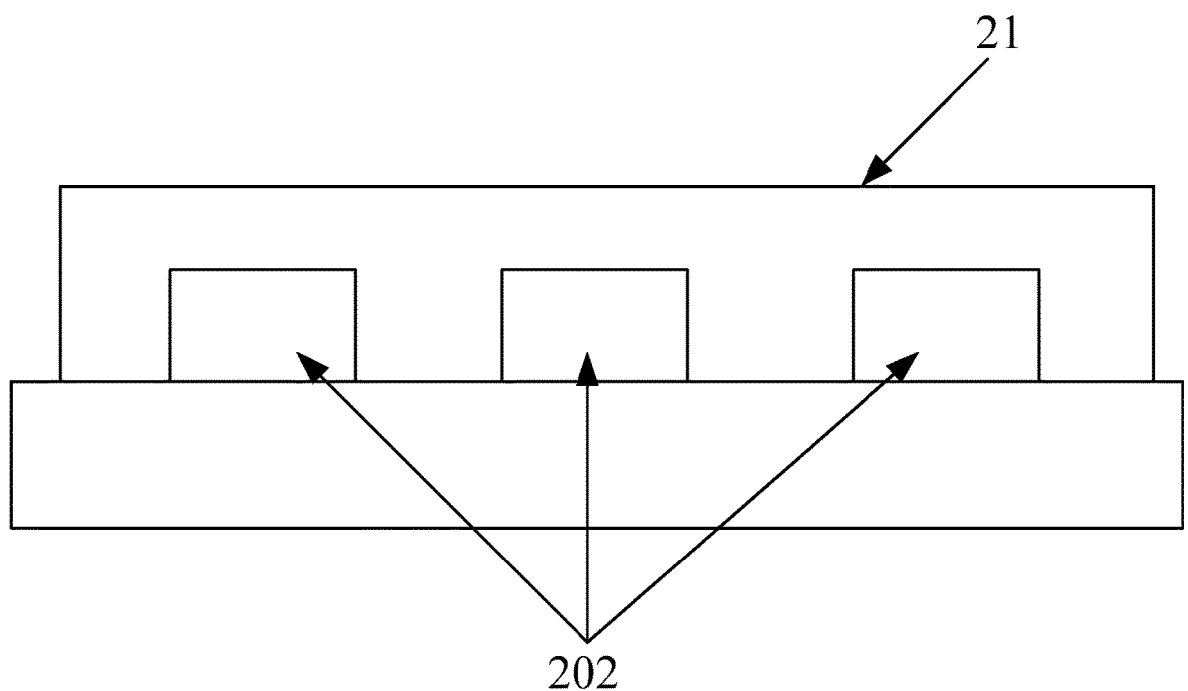
FIG. 15 is a schematically structural diagram of a formed first film layer in the embodiment shown in FIG. 14.

FIGS. 15 to 21 are schematically structural diagrams of a display panel manufactured in accordance with the above method in the present application. Illustratively, FIG. 15 is a schematically structural diagram of a first film layer formed at the periphery of a first electrode provided by an embodiment of the present application. As shown in FIG. 15, the first film layer 21 is formed at the periphery of each first electrode 202, so that the first film layer 21 covers the first electrode layer; and the thickness of the first film layer 21 is greater than that of each first electrode 202.

Figure 16:
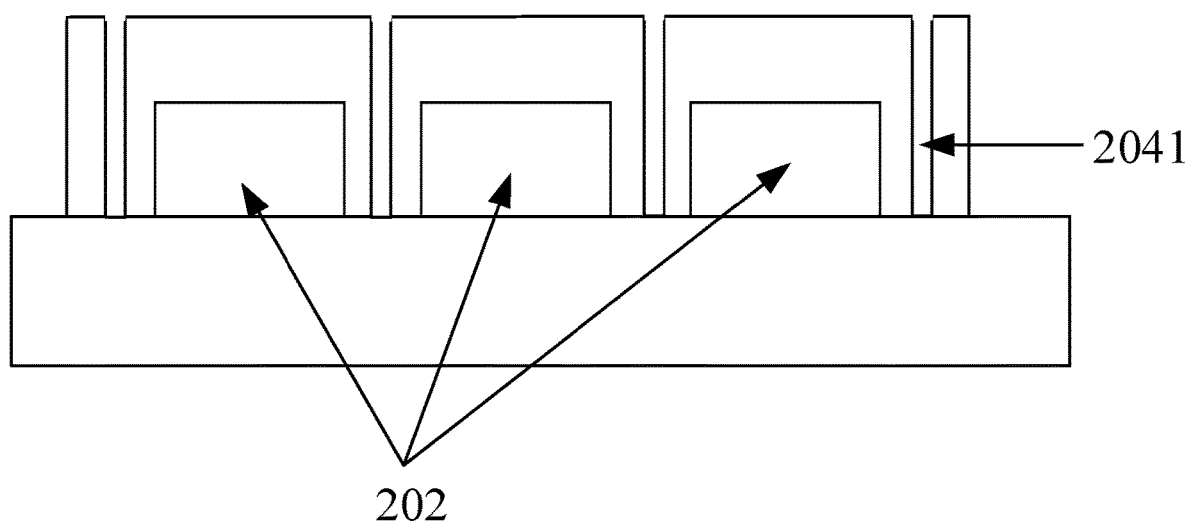
FIG. 16 is a schematically structural diagram of a formed conductive isolation region in the embodiment shown in FIG. 14.

Illustratively, FIG. 16 is a schematically structural diagram of a conductive isolation region thoroughly formed in the thickness direction of the first film layer provided by an embodiment of the present application. For example, the schematically structural diagram of the conductive isolation region 2041 thoroughly formed in the thickness direction of the first film layer 21 shown in FIG. 15 may be as shown in FIG. 16. The conductive isolation region 2041 is used to isolate electrical connections between adjacent pixel units. Illustratively, the conductive isolation region 2041 may be of a hollow through hole structure.

Figure 17:
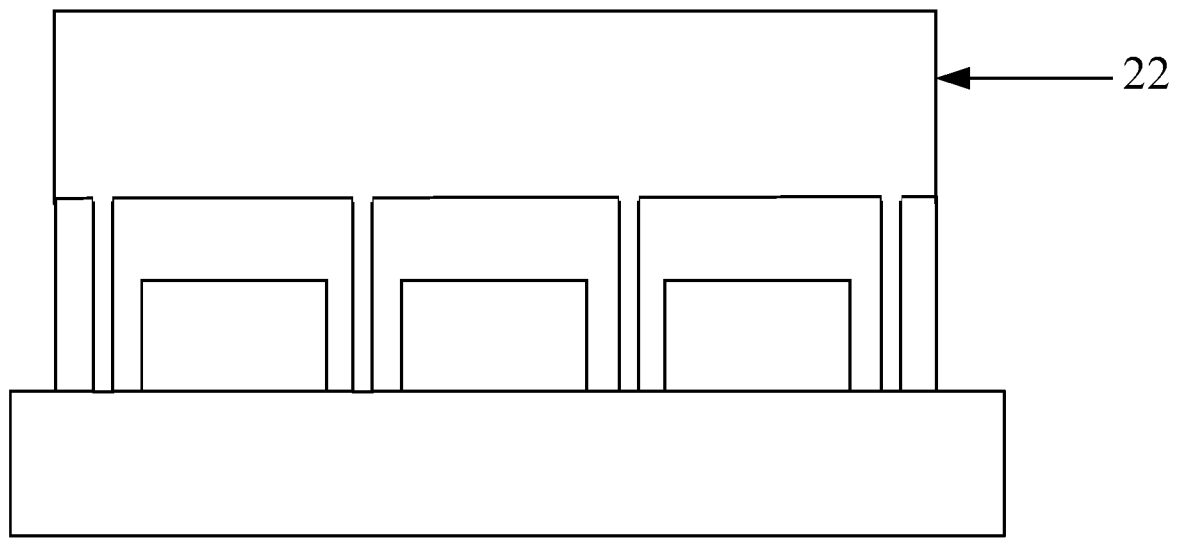
FIG. 17 is a schematically structural diagram of a formed second film layer in the embodiment shown in FIG. 14.

Illustratively, FIG. 17 is a schematically structural diagram of a second film layer formed on the first film layer provided by an embodiment of the present application. As shown in FIG. 17, an insulating material is deposited on the substrate on which the first film layer is formed to form the second film layer 22 on the first film layer; and meanwhile, the insulating material is injected into the hollow through hole structure to fill the hollow through hole structure with the insulating material.

Figure 18:
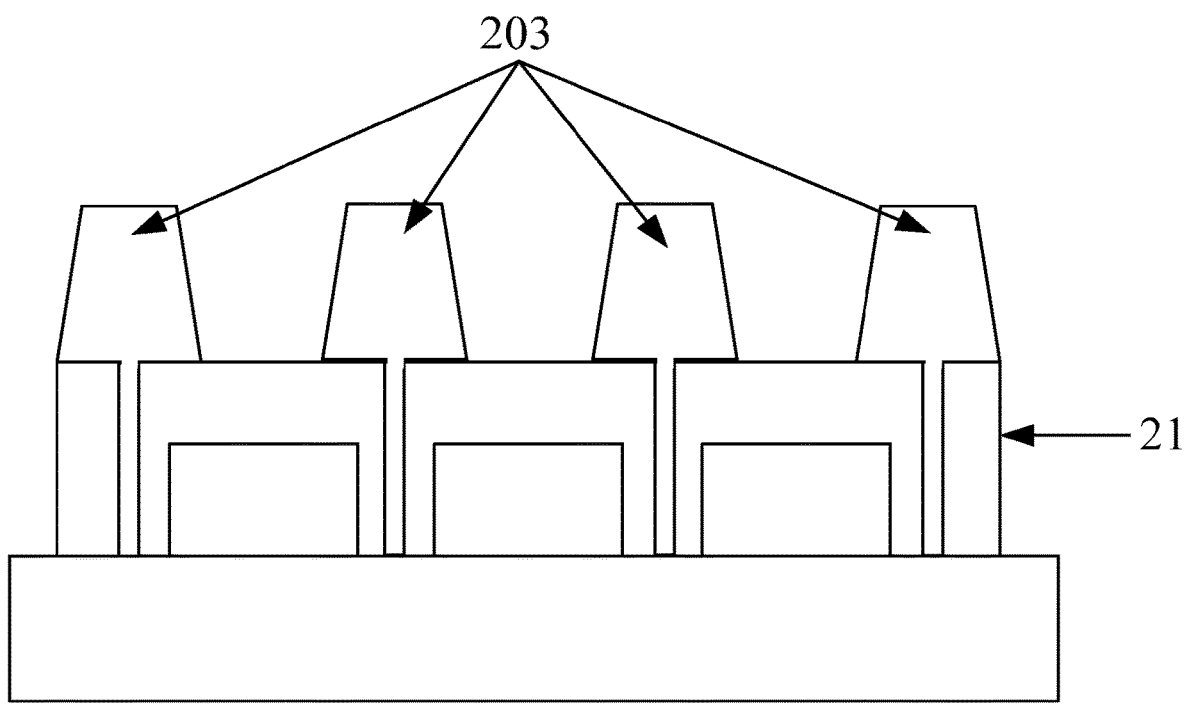
FIG. 18 is a schematically structural diagram of a formed first defining layer in the embodiment shown in FIG. 14.

Illustratively, FIG. 18 is a schematically structural diagram of a first defining layer formed by patterning the second film layer provided by an embodiment of the present application. For example, the schematically structural diagram of the first defining layer 203 formed by patterning the second film layer 22 shown in FIG. 17 may be as shown in FIG. 18.

Figure 19:
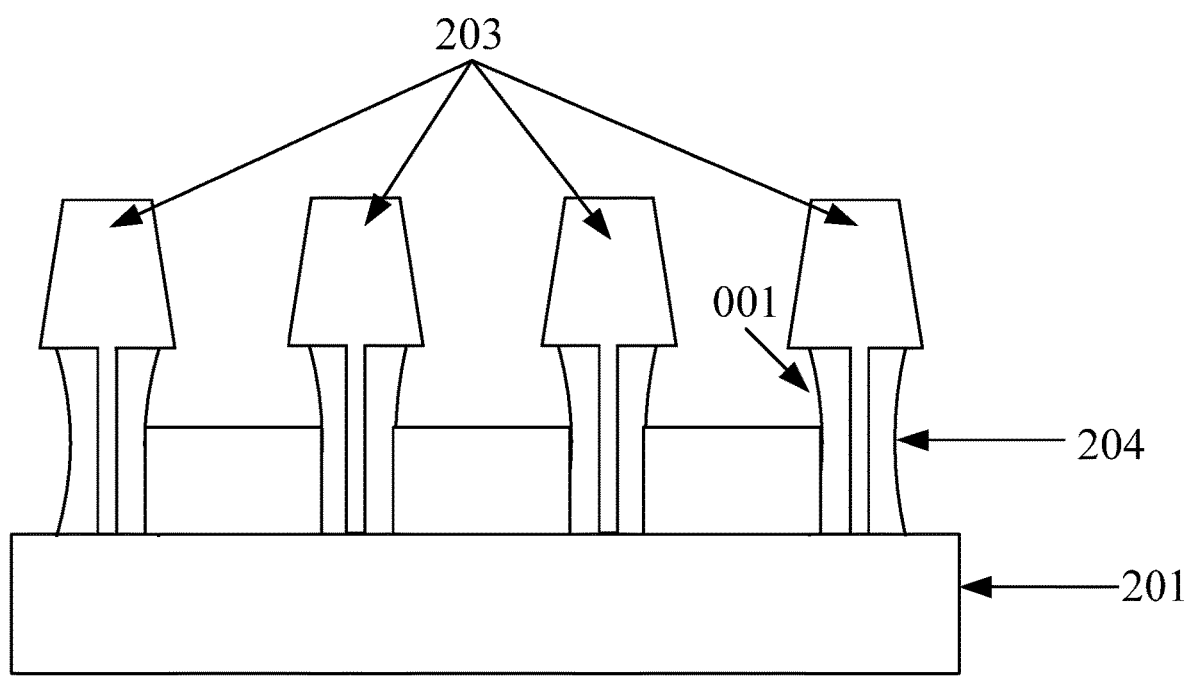
FIG. 19 is a schematically structural diagram of a formed second defining layer in the embodiment shown in FIG. 14.

Illustratively, FIG. 19 is a schematically structural diagram of a second defining layer formed by patterning the first film layer provided by an embodiment of the present application. For example, the schematically structural diagram of the second defining layer 204 formed by patterning the first film layer 21 shown in FIG. 18 may be as shown in FIG. 19. The first defining layer 203 is on a side of the second defining layer 204 away from the substrate 201. An orthographic projection of the first defining layer 203 on the substrate 201 covers that of the second defining layer 204 on the substrate 201; and an opening area of the first defining layer 203 is smaller than that of the second defining layer 204 so as to form a groove.

Figure 20:
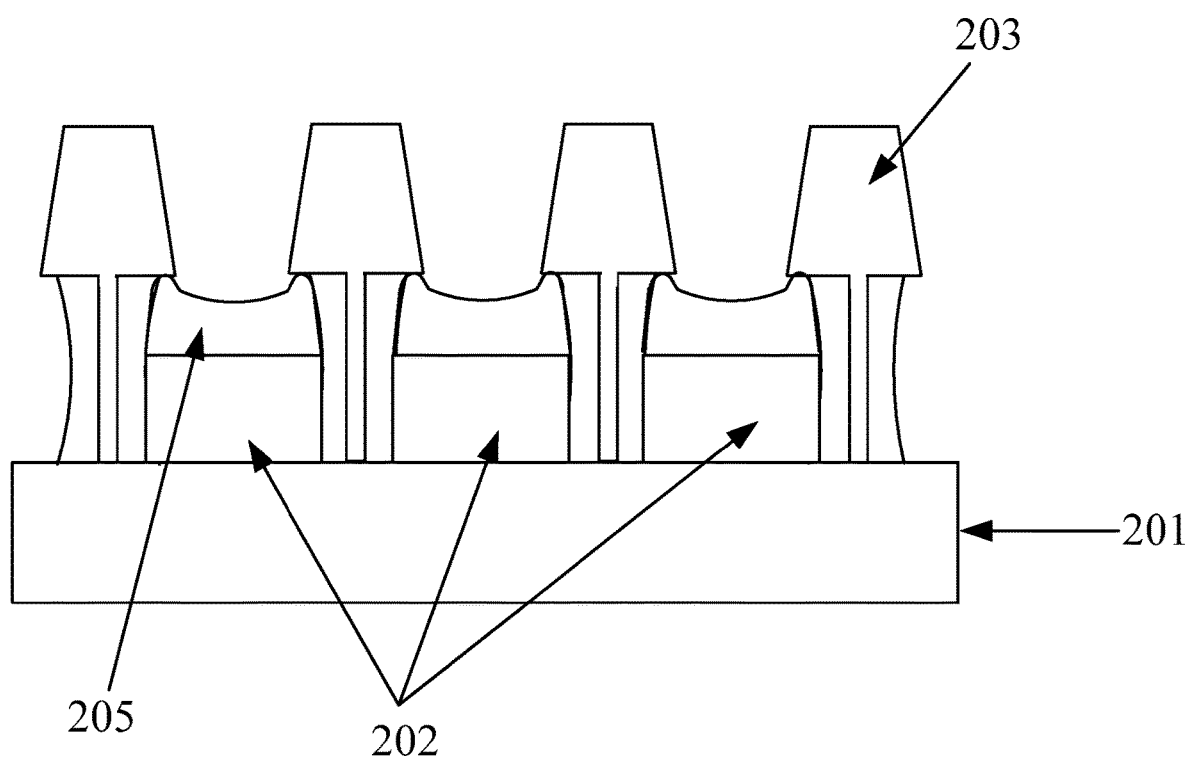
FIG. 20 is a schematically structural diagram of a formed functional layer in the embodiment shown in FIG. 14.

FIG. 20 is a schematically structural diagram of a functional layer formed on the first electrode layer shown in FIG. 19. As shown in FIG. 20, the functional layer includes a plurality of organic functional layers 205 which is arranged on the plurality of first electrodes 202 and which is in one-to-one correspondence with the plurality of first electrodes 202. At least a portion of the raised edge of the organic functional layer 205 is in the groove; and an orthographic projection of at least the portion of the raised edge of each organic functional layer 205 on the substrate 201 falls into an orthographic projection of the first defining layer 203 at the periphery of the corresponding first electrode 202 on the substrate 201. The thickness of the edge region of the organic functional layer 205 is greater than that of the remaining region of the organic functional layer 205.

Figure 21:
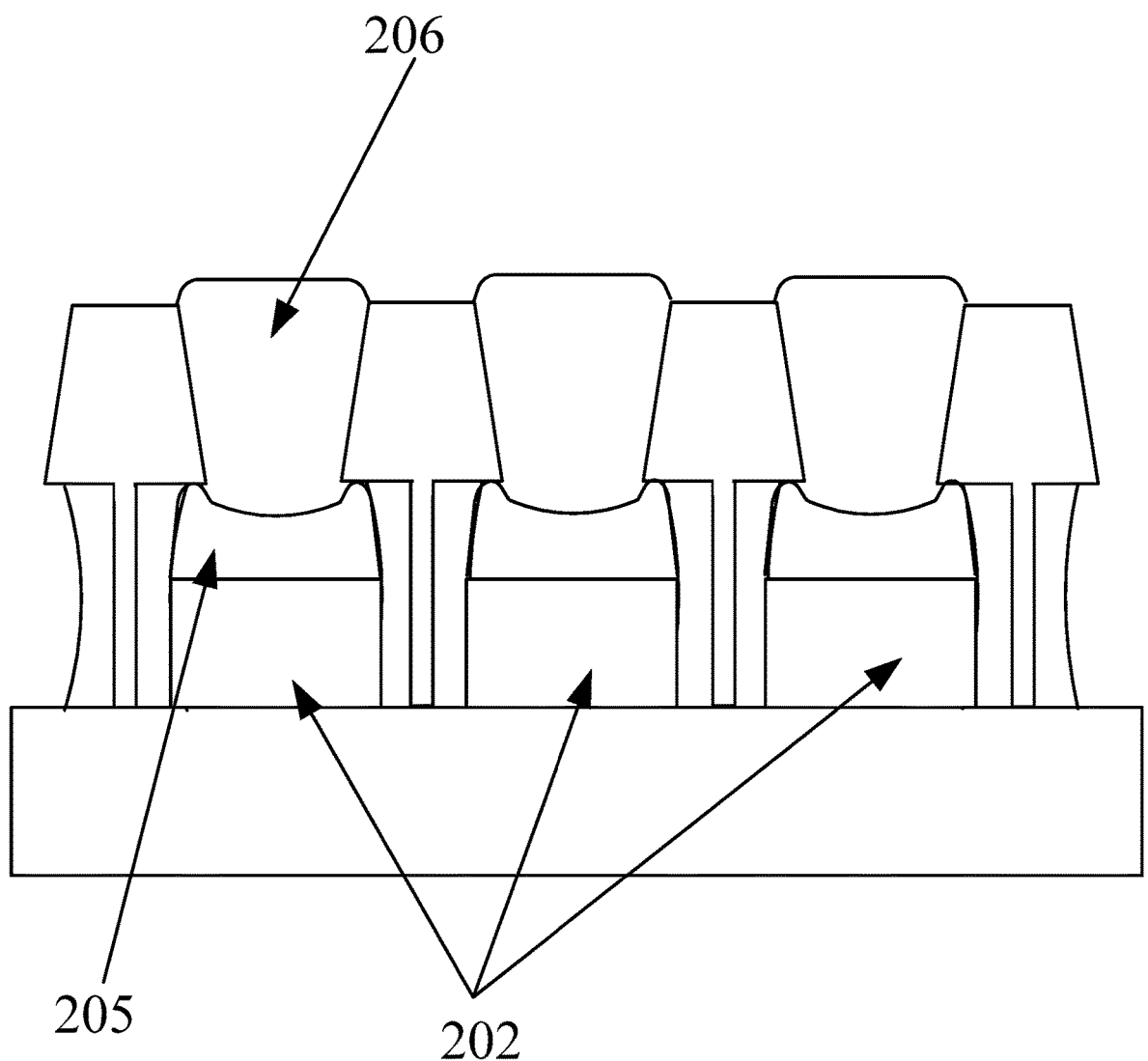
FIG. 21 is a schematically structural diagram of a formed second electrode in the embodiment shown in FIG. 14.

FIG. 21 is a schematically structural diagram of a second electrode formed on the functional layer shown in FIG. 20. Illustratively, as shown in FIG. 21, a plurality of second electrodes 206 arranged on the plurality of organic functional layers 205 in a one-to-one corresponding manner is formed on the functional layer. Each second electrode 206 may be outside the groove at the periphery of the corresponding first electrode 202.

In summary, in the manufacturing method of the display panel provided by the embodiment of the present application, the first defining layer and the second defining layer are formed on the substrate, and the first defining layer and the second defining layer form the groove. The second defining layer made of the conductive material is provided with the conductive isolation region used to isolate electrical connections between adjacent pixel units. The functional layer formed on the first electrode layer includes the plurality of organic functional layers. At least a portion of the raised edge of the organic functional layer is in the groove formed by the first defining layer and the second defining layer; and the orthographic projection of at least the portion of the raised edge of each organic functional layer on the substrate falls into the orthographic projection of the first defining layer at the periphery of the corresponding first electrode on the substrate. During forming of the second electrode, the portion of the first defining layer that protrudes from the second defining layer blocks the second electrode, so that at least the portion of the raised edge of the organic functional layer is not in contact with the second electrode, and thus does not emit light during display. Therefore, both the brightness uniformity and the display effect of the display panel are improved.

The embodiments of the present application further provide a display device, which includes a display panel. The display panel may be as shown in FIG. 1A, FIG. 1F, FIG. 3A, FIG. 13, or FIG. 21. The display may be electronic paper, a mobile phone, a tablet computer, a TV, a display, a notebook computer, a digital photo frame, a navigator, or any other product or component having a display function.

The foregoing descriptions are only exemplary embodiments of the present application, and are not intended to limit the present application. Within the spirit and principles of the application, any modifications, equivalent substitutions, improvements, etc., are within the protection scope defined by the claims attached to the present application.

What is claimed is:

1. A display panel, comprising:
   a substrate; and
   a plurality of pixel units and a pixel defining layer which are on the substrate, each of at least one of the pixel units comprises an organic functional layer, and the organic functional layer has a raised edge; wherein
   the pixel defining layer comprises a first defining layer and a second defining layer, the first defining layer is on a side of the second defining layer away from the substrate; and an orthographic projection of the organic functional layer of each pixel unit on the substrate is surrounded by an orthographic projection of the second defining layer on the substrate, an orthographic projection of the first defining layer on the substrate covers the orthographic projection of the second defining layer on the substrate, and the orthographic projection of the first defining layer on the substrate overlaps with an orthographic projection of at least a portion of the raised edge on the substrate,
   wherein each of the at least one of the pixel units further comprises a first electrode and a second electrode, the organic functional layer is on a side of the first electrode away from the substrate, and the second electrode is on a side of the first defining layer away from the organic functional layer, and
   wherein a material of the second defining layer is a conductive material, the second defining layer has a conductive isolation region, and the conductive isolation region is used to isolate first electrodes in any two adjacent pixel units.

2. The display panel of claim 1, wherein an orthographic projection of the first electrode of each pixel unit on the substrate is surrounded by the orthographic projection of the second defining layer on the substrate; and a thickness of the second defining layer is more than or equal to the sum of a thickness of the first electrode and a thickness of the organic functional layer.

3. The display panel of claim 1, wherein the material of the first defining layer is polyimide; and the material of the second defining layer is any one of silicon nitride, silicon monoxide, and a metal oxide.

4. The display panel of claim 1, wherein the orthographic projection of the first defining layer on the substrate covers orthographic projection of the raised edge of at least one of the pixel units on the substrate.

5. The display panel of claim 1, wherein a surface of the second defining layer adjacent to the organic functional layer has a depression, and the depression is used to contain at least a portion of the raised edge of the organic functional layer.

6. The display panel of claim 1, wherein a through hole is in the conductive isolation region of the second defining layer, and the through hole is filled with an insulating material.

7. The display panel of claim 1, wherein a through hole is in the conductive isolation region of the second defining layer, a portion of the first defining layer is in the through hole, and the material of the first defining layer is an insulating material.

8. The display panel of claim 1, wherein an orthographic projection of the second electrode on the substrate covers a portion of the orthographic projection of the organic functional layer on the substrate that is not covered by the orthographic projection of the first defining layer on the substrate.

9. The display panel of claim 1, wherein a material of the first defining layer is an insulating material; and a material of the second defining layer is any one of an insulating material and a conductive material.

10. A display device, comprising a display panel, wherein the display panel comprises:
    a substrate; and
    a plurality of pixel units and a pixel defining layer which are on the substrate, each of at least one of the pixel units comprises an organic functional layer, and the organic functional layer has a raised edge; wherein
    the pixel defining layer comprises a first defining layer and a second defining layer, the first defining layer is on a side of the second defining layer away from the substrate; and an orthographic projection of the organic functional layer of each pixel unit on the substrate is surrounded by an orthographic projection of the second defining layer on the substrate, an orthographic projection of the first defining layer on the substrate covers the orthographic projection of the second defining layer on the substrate, and the orthographic projection of the first defining layer on the substrate overlaps with an orthographic projection of at least a portion of the raised edge on the substrate,
    wherein each of the at least one of the pixel units further comprises a first electrode and a second electrode, the organic functional layer is on a side of the first electrode away from the substrate, and the second electrode is on a side of the first defining layer away from the organic functional layer,
    wherein a material of the second defining layer is a conductive material, the second defining layer has a conductive isolation region, and the conductive isolation region is used to isolate first electrodes in any two adjacent pixel units.

11. The display device of claim 10, wherein the orthographic projection of the first defining layer on the substrate covers orthographic projection of the raised edge of at least one of the pixel units on the substrate.

12. The display device of claim 10, wherein a surface of the second defining layer adjacent to the organic functional layer has a depression, and the depression is used to contain at least a portion of the raised edge of the organic functional layer.

13. The display device of claim 10, wherein a through hole is in the conductive isolation region of the second defining layer, a portion of the first defining layer is in the through hole, and the material of the first defining layer is an insulating material.

14. The display device of claim 10, wherein an orthographic projection of the first electrode of each pixel unit on the substrate is surrounded by the orthographic projection of the second defining layer on the substrate; and a thickness of the second defining layer is more than or equal to the sum of a thickness of the first electrode and a thickness of the organic functional layer.

15. The display device of claim 10, wherein an orthographic projection of the second electrode on the substrate covers a portion of the orthographic projection of the organic functional layer on the substrate that is not covered by the orthographic projection of the first defining layer on the substrate.

16. A manufacturing method of a display panel, comprising:
   forming a plurality of pixel units and a pixel defining layer which are on the substrate;
   wherein each of at least one of the pixel units comprises an organic functional layer, and the organic functional layer has a raised edge; the pixel defining layer comprises a first defining layer and a second defining layer, the first defining layer is on a side of the second defining layer away from the substrate; and an orthographic projection of the organic functional layer of each pixel unit on the substrate is surrounded by an orthographic projection of the second defining layer on the substrate, an orthographic projection of the first defining layer on the substrate covers the orthographic projection of the second defining layer on the substrate, and the orthographic projection of the first defining layer on the substrate overlaps with an orthographic projection of at least a portion of the raised edge on the substrate,
   wherein each of the at least one of the pixel units further comprises a first electrode and a second electrode, the organic functional layer is on a side of the first electrode away from the substrate, and the second electrode is on a side of the first defining layer away from the organic functional layer, and
   wherein a material of the second defining layer is a conductive material, the second defining layer has a conductive isolation region, and the conductive isolation region is used to isolate first electrodes in any two adjacent pixel units.

* * * * *